United States Patent
Li et al.

(10) Patent No.: US 10,686,467 B1
(45) Date of Patent: Jun. 16, 2020

(54) ACCELERATED COMPRESSION METHOD AND ACCELERATED COMPRESSION APPARATUS

(71) Applicant: Shanghai Zhaoxin Semiconductor Co., Ltd., Shanghai (CN)

(72) Inventors: Lin Li, Beijing (CN); Zheng Wang, Beijing (CN); Xiaoyang Li, Beijing (CN); Zongpu Qi, Beijing (CN)

(73) Assignee: Shanghai Zhaoxin Semiconductor Co., Ltd., Shanghai (CN)

( * ) Notice: Subject to any disclaimer, the term of this patent is extended or adjusted under 35 U.S.C. 154(b) by 0 days.

(21) Appl. No.: 16/431,694

(22) Filed: Jun. 4, 2019

(30) Foreign Application Priority Data

Jan. 30, 2019 (CN) .......................... 2019 1 0091990

(51) Int. Cl.
*H03M 7/30* (2006.01)
*G06F 9/38* (2018.01)
*G06F 9/30* (2018.01)

(52) U.S. Cl.
CPC ...... *H03M 7/3086* (2013.01); *G06F 9/30145* (2013.01); *G06F 9/3861* (2013.01); *G06F 9/3867* (2013.01); *H03M 7/3088* (2013.01)

(58) Field of Classification Search
CPC .............. H03M 7/3086; H03M 7/3088; G06F 9/30145; G06F 9/3861; G06F 9/3867
USPC ...................................... 341/50, 106, 107, 87
See application file for complete search history.

(56) References Cited

U.S. PATENT DOCUMENTS

| | | | |
|---|---|---|---|
| 9,628,111 B2 * | 4/2017 | Henry | H03M 7/42 |
| 9,965,570 B2 * | 5/2018 | Chen | G06F 16/90344 |
| 10,070,145 B2 * | 9/2018 | Ye | H04N 19/593 |

* cited by examiner

*Primary Examiner* — Brian K Young
(74) *Attorney, Agent, or Firm* — JCIPRNET

(57) ABSTRACT

An accelerated compression method and apparatus are provided. The accelerated compression apparatus includes a look-ahead memory, a string matching processing pipeline and a control circuit. According to an issue pointer, the control circuit issues sub-strings of a string to be compressed from the look-ahead memory to the string matching processing pipeline for a matching operation to obtain a matched length and a matched offset. The control circuit determines a new retiring position according to the matched length corresponding to a retire pointer. When the new retiring position exceeds an issuing position pointed by the issue pointer, the control circuit resets the string matching processing pipeline.

18 Claims, 12 Drawing Sheets

ACCELERATED COMPRESSION METHOD AND ACCELERATED COMPRESSION APPARATUS

CROSS-REFERENCE TO RELATED APPLICATION

This application claims the priority benefit of China application serial no. 201910091990.7, filed on Jan. 30, 2019. The entirety of the above-mentioned patent application is hereby incorporated by reference herein and made a part of this specification.

BACKGROUND

1. Field of the Invention

The invention relates to an accelerated apparatus, and more particularly, relates to an accelerated compression method and an accelerated compression apparatus for performing hardware acceleration in compression operations.

2. Description of Related Art

A compression accelerator is a hardware specifically designed to assist in performing compression/decompression. The compression accelerator generally adopts use of dictionary-based compression algorithms (e.g., LZ77, LZSS, LZ78 or LZW algorithms). Position information (including a matched length and a matched offset) in a dictionary (i.e., a sliding window) is used to replace raw data, so as to achieve the goal of data compression. For the compression accelerator, the most complicated part is a longest-prefix string matching, and the longest first-code string matching can usually be classified as a content-based addressable memory (CAM-based) method and a hash-based method.

For example, a hash-based string matcher usually converts a plurality of characters (hash keys) in a string to be compressed into hash values by using a hash circuit. The hash circuit then performs table look-up and comparison on a hash table according to the hash values. If the hash value corresponding to the hash key appears in the hash table, it means that the content of the dictionary (the sliding window) include a specific character (the hash key). Accordingly, the compression accelerator can obtain the position (the matched offset) of that specific character in the dictionary (the sliding window) for a longest match (LM) comparison. The so-called longest match comparison is starting from the matched offset and looking for the longest length matchable in the dictionary (the sliding window). Lastly, the compression accelerator can output a match pair to replace the raw data, so as to achieve the data compression. The match pair includes the matched length and the matched offset.

In an example where one character occupies one byte, the previous hash key is obtained byte by byte from the string to be compressed. When the mentioned match pair appears in the content of the string to be compressed, the characters covered by the matched length may already be sent to the hash circuit for calculation or even for the longest match (LM) comparison. The previous calculation or the LM comparison of these characters becomes an unnecessary redundant operation, resulting in a decrease in matching efficiency.

SUMMARY OF THE INVENTION

The invention provides an accelerated compression method and an accelerated compression apparatus for reducing the redundant operation.

An embodiment of the invention provides an accelerated compression method configured to be implemented in an accelerated compression apparatus. The accelerated compression apparatus includes a look-ahead memory and a string matching processing pipeline. The accelerated compression method includes: issuing at least one sub-string from a string to be compressed stored in the look-ahead memory according to an issue pointer; sending the sub-string to the string matching processing pipeline for a matching operation to obtain a matched length and a matched offset of the sub-string; determining a new retiring position according to a retire pointer and the matched length corresponding to a retiring position in the string to be compressed pointed by the retire pointer; and resetting the string matching processing pipeline when the new retiring position exceeds an issuing position in the string to be compressed pointed by the issuance pointer.

An embodiment of the invention provides an accelerated compression apparatus. The accelerated compression apparatus includes a string matching processing pipeline, a look-ahead memory and a control circuit. The control circuit is coupled to the string matching processing pipeline and the look-ahead memory. The control circuit issues at least one sub-string from a string to be compressed stored in the look-ahead memory according to an issuance pointer. The control circuit sends the sub-string to the string matching processing pipeline for a matching operation to obtain a matched length and a matched offset of the sub-string. The control circuit determines a new retiring position according to a retire pointer and the matched length corresponding to a retiring position in the string to be compressed pointed by the retire pointer. The control circuit resets the string matching processing pipeline when the new retiring position exceeds an issuing position in the string to be compressed pointed by the issue pointer.

Based on the above, the accelerated compression method and the accelerated compression apparatus described in various embodiments of the invention can check the matched length and the issue pointer during the retirement. When the new retiring position associated with the matched length exceeds the issuing position pointed by the issue pointer, the control circuit can reset the string matching processing pipeline, so as to release calculation resources and related memory spaces of the string matching processing pipeline as soon as possible. In this way, the accelerated compression method and the accelerated compression apparatus described in various embodiments of the invention can reduce the redundant calculation.

To make the above features and advantages of the invention more comprehensible, several embodiments accompanied with drawings are described in detail as follows.

DETAILED DESCRIPTION

Figure 1:
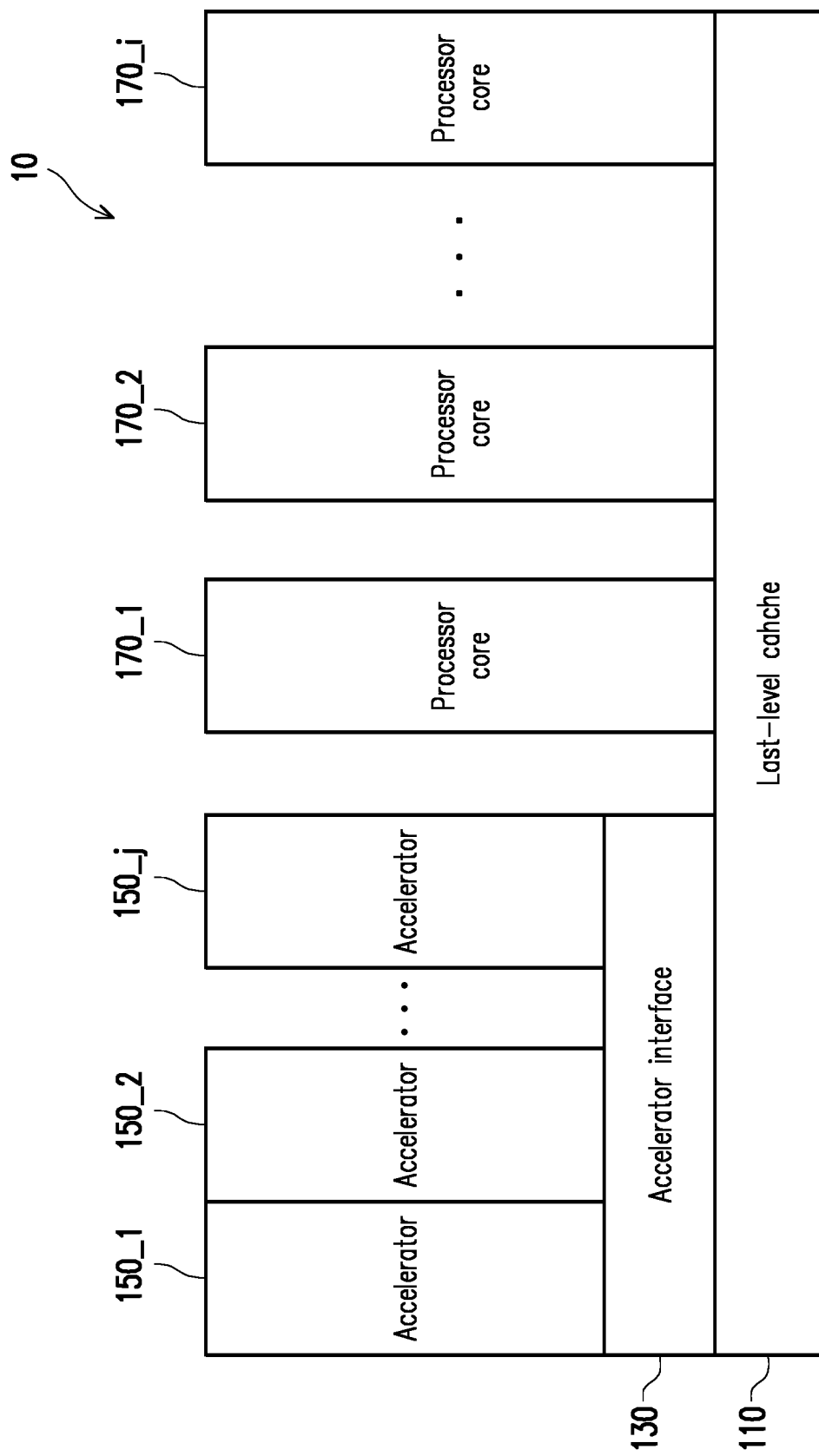
FIG. 1 is a system architecture diagram of a microprocessor according to an embodiment of the invention.

The term "coupled (or connected)" used in this specification (including claims) may refer to any direct or indirect connection means. For example, "a first device is coupled (connected) to a second device" should be interpreted as "the first device is directly connected to the second device" or "the first device is indirectly connected to the second device through other devices or connection means". Moreover, elements/components/steps with same reference numerals represent same or similar parts in the drawings and embodiments. Elements/components/steps with the same reference numerals or names in different embodiments may be cross-referenced.

FIG. 1 is a system architecture diagram of a microprocessor 10 according to an embodiment of the invention. The microprocessor 10 may include a plurality of processor cores, such as processor cores 170_1, 170_2, . . . , and 170_i shown in FIG. 1. The microprocessor 10 further includes a plurality of accelerators, such as accelerators 150_1, 150_2, . . . , and 150_j shown in FIG. 1. Here, i and j are integers, which vary with different design requirements. For instance, the accelerators 150_1 to 150_j may be accelerator functional units (AFU). Any device included in the processor cores 170_1 to 170_i is involved in the execution of computer instructions, and includes an arithmetic logic unit (ALU), a floating point unit (FPU), a L1 cache and a L2 cache. Each processor core adopts an instruction cycle (a.k.a. an extract-decode-execute cycle) as a basic operation flow. Such flow is used to allow the processor cores to obtain a program instruction, determine what operations this program instruction intends to perform, and perform these operations.

The accelerators 150_1 to 150_i can execute different functions and can be connected to a last-level cache 110 via an accelerator interface 130. The accelerators 150_1 to 150_i can exchange data with the processor cores 170_1 to 170_i via the last-level cache 110 using a virtual address. Any one of the accelerators 150_1 to 150_i can assist the processor cores 170_1 to 170_i to perform specific functions in a more efficient manner, so as to mitigate the workload for the processor cores 170_1 to 170_i. The specific functions include compression, encryption, decryption, regular matching, and/or other functions with a large amount of computation. One of the accelerators 150_1 to 150_j may be a compression accelerator configured to complete functions in a string compression.

Figure 2:
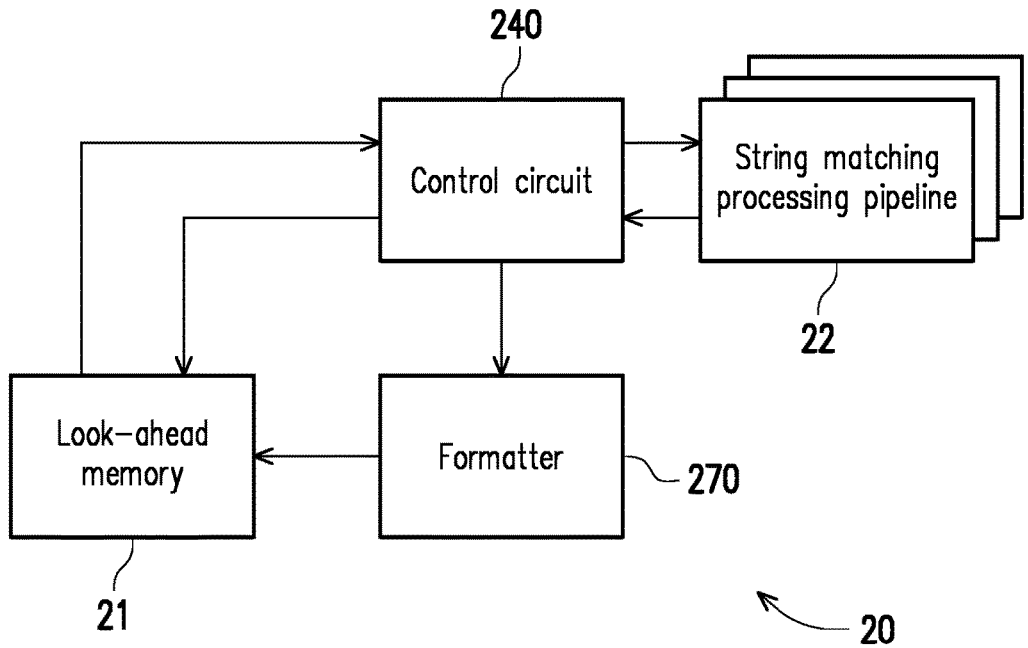
FIG. 2 is a circuit block diagram illustrating an accelerated compression apparatus according to an embodiment of the invention.

FIG. 2 is a circuit block diagram illustrating an accelerated compression apparatus 20 according to an embodiment of the invention. When one of the accelerators 150_1 to 150_j shown in FIG. 1 is implemented as the compression accelerator, details of such compression accelerator can refer to the related description of the accelerated compression apparatus 20 shown in FIG. 2. With reference to FIG. 2, the accelerated compression apparatus 20 includes at least one string matching processing pipeline 22 and one look-ahead memory 21. In an embodiment, the accelerated compression apparatus 20 further includes one control circuit 240 and one formatter 270. The control circuit 240 is coupled to the string matching processing pipeline 22, the look-ahead memory 21 and the formatter 270. The look-ahead memory 21 is configured to store a raw string (i.e., a string to be compressed) and a compressed string. The look-ahead memory 21 further includes an issue pointer and a retire pointer. The issue pointer points to the start character of the next sub-string in the string to be compressed that needs to be issued to the string matching processing pipeline 22 for a matching operation. The string matching processing pipeline 22 can perform the matching operation for the issued sub-string to obtain a match pair (i.e., a matched length and a matched offset). The retire pointer points to the next sub-string in the string to be compressed that needs to be retired, i.e., points to the start character of the sub-string that has completed the matching operation.

In an embodiment, the control circuit 240 issues the sub-string, which starts from a starting position in the look-ahead memory 21 pointed by the issue pointer, to the string matching processing pipeline 22 for the matching operation. In the string matching processing pipeline 22 based on hash, the string matching processing pipeline 22 can perform a hash comparison and a longest match comparison to obtain the match pair (i.e., the matched length and the matched offset). In other words, in the look-ahead memory 21, characters between a position pointed by the retire pointer and a position pointed by the issue pointer are characters in the matching operation currently performed in the string matching processing pipeline 22. When the match pair exists at the position pointed by the retire pointer, the matching length range of the match pair may cover the characters that have entered the string matching processing pipeline 22. However, the characters that are already in the matching length of this matching pair no longer need to be matched (e.g., operations including the hash comparison and the longest match comparison). The following embodiments of FIGS. 3 to 6 will specifically illustrate how the invention reduces the unnecessary matching operation (i.e., the redundant operation) that occupies hardware resources of the string matching processing pipeline 22.

Figure 3:
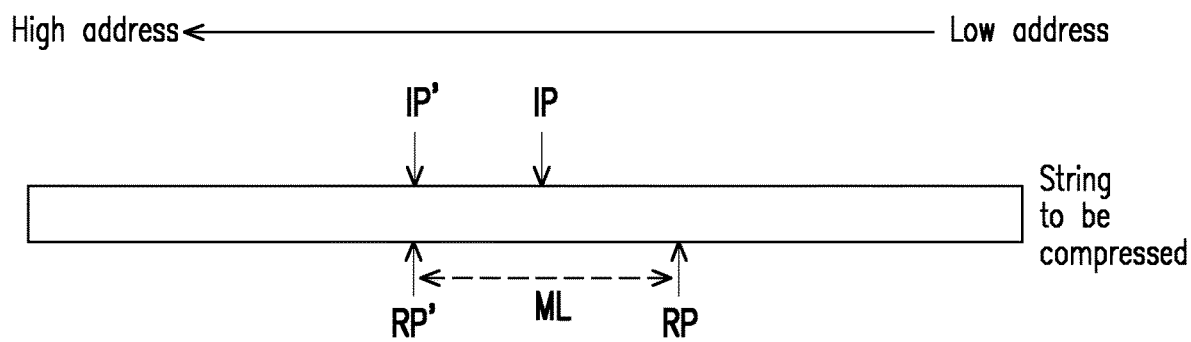
FIG. 3 is a schematic diagram illustrating an operation situation of the issue pointer and the retire pointer according to an embodiment of the invention.

FIG. 3 is a schematic diagram illustrating an operation situation of the issue pointer IP and the retire pointer RP according to an embodiment of the invention. A direction to the right of FIG. 3 represents a low address direction of the string to be compressed, and a direction to the left of FIG. 3 represents a high address direction of the string to be compressed. The issuance pointer IP points to the start character of the next sub-string in the string to be compressed that needs to be issued and sent to the string matching processing pipeline 22 for the matching operation (a position of such start character is also referred to as "an issuing position" hereinafter). With the progress in the issuance, the issue pointer IP may move dynamically towards the high address direction. In an example where one character occupies one byte, the issue pointer IP moves byte by byte to sequentially point to the start character of each sub-string to which the matching operation needs to be performed. The control circuit 240 extracts (or issues) at least one sub-string from the string to be compressed stored in the look-ahead memory 21 according to the issue pointer IP, and sends the sub-string to the string matching processing pipeline 22 for the matching operation. In the embodiment where the string matching processing pipeline 22 adopts a hash matching technique, after the sub-string is sent to the string matching processing pipeline 22, the string matching processing pipeline 22 can perform the hash comparison and the longest match comparison for the issued sub-string to obtain the match pair of the sub-string (i.e., the matched length and the matched offset). It should be noted that, the matching technique used by the string matching processing pipeline 22 for obtaining the matched length and the matched offset is not particularly limited by the invention. The accelerated compression method of the invention is also applicable to the compression accelerator using other matching techniques.

The retire pointer RP points to the start character of the next sub-string in the string to be compressed that needs to be retired (a position of such start character is also referred to as "a retiring position" hereinafter). After the matching operation is completed for the sub-string, the string matching processing pipeline 22 can perform a retirement operation for the sub-string while outputting a matching result of the sub-string to the formatter 270. In an embodiment, when a done flag corresponding to one sub-string pointed by the retire pointer RP is set to indicate that the matching operation for the sub-string is completed, the retirement operation for the sub-string will be performed; if the done flag of the sub-string pointed by the retire pointer RP is not set, the retire pointer RP stays at the position of the start character of the sub-string until the done flag corresponding to the flag is set. That is to say, the retirement operation of the sub-string needs to be performed according to a sequence of original characters of the string to be compressed. With the progress in the retirement, the retire pointer RP may move sequentially towards the high address direction. According to a retire pointer RP and according to a matched length ML corresponding to the retiring position in the string to be compressed pointed by the retire pointer RP, the control circuit 240 can determine a new retiring position RP'. In an embodiment, the new retiring position RP'=the retire pointer RP+ the matched length ML. The control circuit 240 can check the matched length ML and the issue pointer IP during the retirement. When the new retiring position RP' associated with the matched length ML exceeds a position (i.e., the issuing position) pointed by the issue pointer IP (i.e., the situation shown in FIG. 3), the control circuit 240 can reset the string matching processing pipeline 22. Accordingly, all the matching operations currently performed in the string matching processing pipeline 22 are stopped and related data of the sub-string in the matching operation currently performed in the string matching processing pipeline 22 are discarded, so as to release calculation resources and related memory spaces of the string matching processing pipeline 22 as soon as possible. In an embodiment, when the new retiring position RP' exceeds the position pointed by the issue pointer IP (i.e., the issuing position), the control circuit 240 can also change the issue pointer IP from pointing to the issuing position to pointing to the new retiring position RP', as shown by the issue pointer IP' in FIG. 3.

The sub-string already in the range of the matched length ML shown in FIG. 3 do not need to enter the string matching processing pipeline 22 again for the matching operation. Once the sub-string that does not need to be compared is pushed into the string matching processing pipeline 22, calculation performed by the string matching processing pipeline 22 for such sub-string is regarded to as a redundant calculation. In the string to be compressed, the sub-string corresponding to characters between a position pointed by the retire pointer RP and a position pointed by the issue pointer IP is the sub-string already in the matching operation currently performed by the string matching processing pipeline 22. When the new retiring position RP' exceeds the position pointed by the issue pointer IP, the control circuit 240 can instantly reset the string matching processing pipeline 22, so as to prevent the sub-string that does not need the comparison from occupying resources of the string matching processing pipeline 22. Further, in another embodiment, when the new retiring position RP' exceeds the position pointed by the issue pointer IP (i.e., the issuing position), the control circuit 240 can also instantly change the issue pointer IP to point to the new retiring position RP', so as to prevent the sub-string that do not needs to be compared from being issued to the string matching processing pipeline 22. In this way, the accelerated compression apparatus 20 of this embodiment can reduce the redundant calculation.

The control circuit 240 can output a result to the formatter 270 according to the retire pointer RP and according to the matched length ML and the matched offset corresponding to the position in the string to be compressed pointed by the retire pointer RP (i.e., the retiring position) so that the formatter 270 accordingly compresses the string to be compressed. The control circuit 240 can change the retire pointer RP from pointing to the retiring position to pointing to the new retiring position RP' after the control circuit 240 outputs the result to the formatter 270.

With respect to issue regarding "the new retiring position RP' does not exceed the position pointed by the issue pointer IP", three solutions are introduced as follows.

Figure 4:
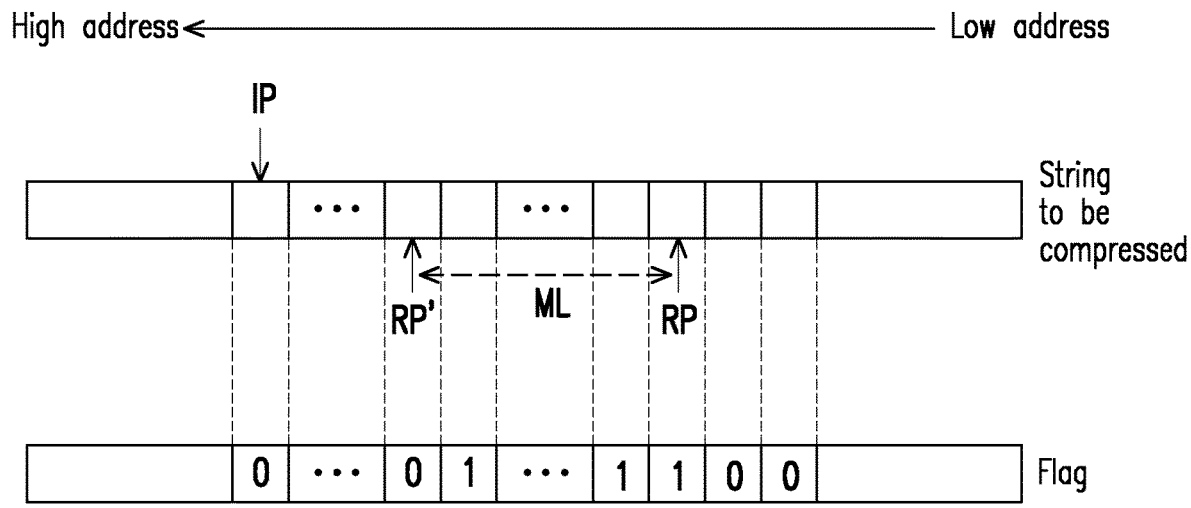
FIG. 4 is a schematic diagram illustrating an operation situation of the issue pointer and the retire pointer according to another embodiment of the invention.

The First Solution:

FIG. 4 is a schematic diagram illustrating an operation situation of the issue pointer IP and the retire pointer RP according to another embodiment of the invention. In the first solution, when the new retiring position RP' does not exceed the position in the string to be compressed pointed by the issue pointer IP (i.e., "the issuing position"), a jump operation of the issue pointer IP and the retire pointer RP may be a normal operation (which will be described in detail below). The look-ahead memory 21 can correspondingly configure one flag for each character in the stored string to be compressed. Each character in the string to be compressed (i.e., the start character of each sub-string; it should be noted that, the string matching processing pipeline 22 performs the matching operation in units of the sub-strings) is associated with one flag, as shown in FIG. 4. When the new retiring position RP' does not exceed the position in the string to be compressed pointed by the issue pointer IP, the control circuit 240 can set the flag corresponding to each character (i.e., the start character of each sub-string) between the new retiring position RP' and the position pointed by the retire pointer RP (i.e., "the retiring position"). Based on design requirements, in certain embodiments, "set" may refer to setting the logic value of the flag to "1", and "reset"

may refer to setting the logic value of the flag to "0", as shown in FIG. 4. In some other embodiments, "set" may refer to setting the logic value of the flag to "0", and "reset" may refer to setting the logic value of the flag to "1".

Before the string matching processing pipeline 22 performs the matching operation (e.g., including the hash comparison and/or the longest match comparison, which will be described in detail below) for one specific sub-string, the string matching processing pipeline 22 will check the flag corresponding to the start character of that sub-string. The string matching processing pipeline 22 can determine whether to continue the matching operation or not according to the flag. When the flag corresponding to the start character of the sub-string processed by the string matching processing pipeline 22 is set, the string matching processing pipeline 22 can stop processing the sub-string and can discard related data of the sub-string in the string matching processing pipeline 22, so as to release calculation resources and related memory spaces of the string matching processing pipeline 22 as soon as possible. When the flag corresponding to the start character of the sub-string processed by the string matching processing pipeline 22 is not set, the string matching processing pipeline 22 can continue the matching operation (e.g., including the hash comparison and/or the longest match comparison, which will be described in detail below) for the sub-string.

Figure 5:
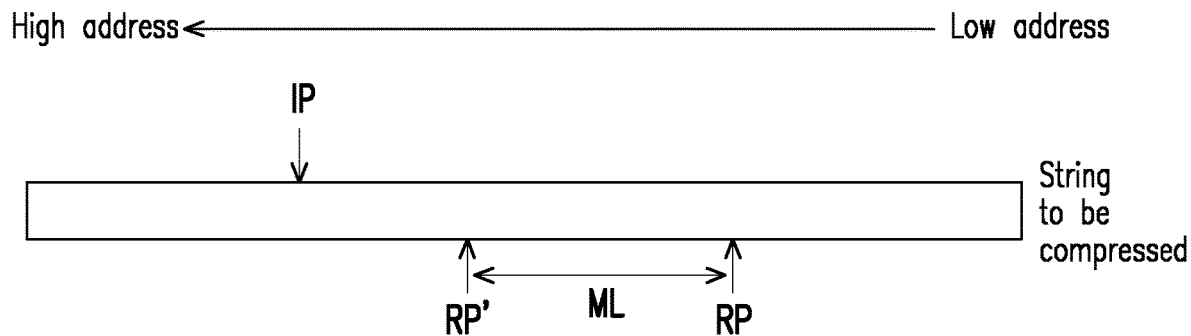
FIG. 5 is a schematic diagram illustrating an operation situation of the issue pointer and the retire pointer according to yet another embodiment of the invention.

The Second Solution:

FIG. 5 is a schematic diagram illustrating an operation situation of the issue pointer IP and the retire pointer RP according to yet another embodiment of the invention. In the second solution, when the new retiring position RP' does not exceed the position in the string to be compressed pointed by the issue pointer IP (i.e., "the issuing position"), the jump operation of the issue pointer IP and the retire pointer RP may be the normal operation (which will be described in detail below). According to the retire pointer RP and according to the matched length ML corresponding to the position pointed by the retire pointer RP (i.e., "the retiring position"), the control circuit 240 can calculate the new retiring position RP'. For example, the new retiring position RP'=the retire pointer RP+ the matched length ML. When the new retiring position RP' does not exceed the position in the string to be compressed pointed by the issue pointer IP (i.e., "the issuing position"), the control circuit 240 can record the new retiring position RP'. Before the string matching processing pipeline 22 performs the matching operation (e.g., including the hash comparison and/or the longest match comparison) for one specific sub-string, the string matching processing pipeline 22 will check the new retiring position RP'. When the starting position of the sub-string processed by the string matching processing pipeline 22 does not exceed the new retiring position RP' (i.e., when this sub-string falls in the range of the matched length ML shown in FIG. 5), the string matching processing pipeline 22 can stop the matching operation for the sub-string and can further discard the related data of the sub-string in the string matching processing pipeline 22, so as to release calculation resources and related memory spaces of the string matching processing pipeline 22 as soon as possible. When the starting position of the sub-string processed by the string matching processing pipeline 22 exceeds the new retiring position RP' (i.e., when this sub-string is not within the range of the matched length shown in FIG. 5), the string matching processing pipeline 22 does not stop the matching operation (e.g., including the hash comparison and/or the longest match comparison) for the sub-string. In an embodiment, the control circuit 240 further stores all the issued sub-strings from the look-ahead memory 21 to an intermediary buffer 230 (which is not shown in FIG. 2, but will be described in detail later in FIG. 7). For example, each sub-string occupies one entry of the intermediary buffer 230 in form of an instance. Here, the starting position of each sub-string processed by the string matching processing pipeline 22 will be stored in the entry corresponding to the respective sub-string in the intermediary buffer 230. Before performing the hash comparison and/or the longest match comparison for each sub-string, the string matching processing pipeline 22 reads the starting position of the sub-string from the corresponding entry of the intermediary buffer 230 to be compared with the current new retiring position RP', so as to determine whether to stop the corresponding operation for the sub-string or not. Here, the starting position is a position where the start character of the sub-string is originally stored in the look-ahead memory 21. It should be noted that, in an embodiment, a size of the look-ahead memory 21 is, for example, 512 bytes, and the depth of the intermediary buffer 230 is, for example, 64 layer (i.e., capable of storing 64 issued sub-strings at the most). Meanwhile, the retire pointer also points to the next sub-string in the intermediary buffer 230 that needs to be retired. Because the intermediary buffer 230 of 64 layers may be directly mapped to 64 sub-strings among all the sub-strings of the look-ahead memory 21, as long as it can be ensured that a distance between the issue pointer and the retire pointer does not exceed 64 during the issuance, the issue pointer and the retire pointer will be identical in both the look-ahead memory 21 and the intermediary buffer 230.

Figure 6:
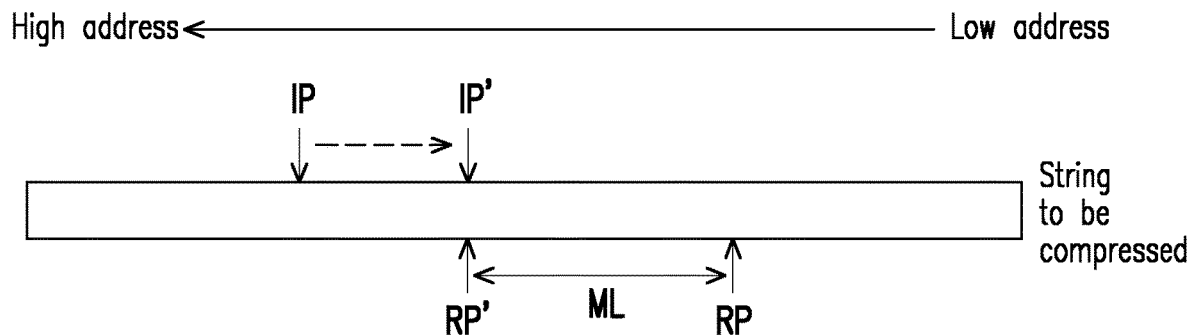
FIG. 6 is a schematic diagram illustrating an operation situation of the issue pointer and the retire pointer according to still another embodiment of the invention.

The Third Solution:

FIG. 6 is a schematic diagram illustrating an operation situation of the issue pointer IP and the retire pointer RP according to still another embodiment of the invention. According to the retire pointer RP and according to the matched length ML corresponding to the position pointed by the retire pointer RP (i.e., "the retiring position"), the control circuit 240 can calculate the new retiring position RP'. When the new retiring position RP' does not exceed the position in the string to be compressed pointed by the issue pointer IP (i.e., "the issuing position"), the control circuit 240 can check a distance between the new retiring position RP' and the position pointed by the issue pointer IP (i.e., "the issuing position"). In the case where the new retiring position RP' does not exceed "the issuing position", when the distance between the new retiring position RP' and "the issuing position" is greater than a threshold distance, the jump operation of the issue pointer IP and the retire pointer RP may be the normal operation (which will be described in detail below). The threshold distance may be determined based on design requirements.

In the case where the new retiring position RP' does not exceed "the issuing position", when the distance between the new retiring position RP' and "the issuing position" is less than the threshold distance, the control circuit 240 can instantly reset the string matching processing pipeline 22 to prevent the sub-string that does not need the matching operation from occupying resources of the string matching processing pipeline 22. In addition, when the distance between the new retiring position RP' and "the issuing position" is less than the threshold distance, the control circuit 240 can change the issue pointer IP from pointing to "the issuing position" to pointing to the new retiring position RP', as shown by the issue pointer IP' in FIG. 6.

Figure 7:
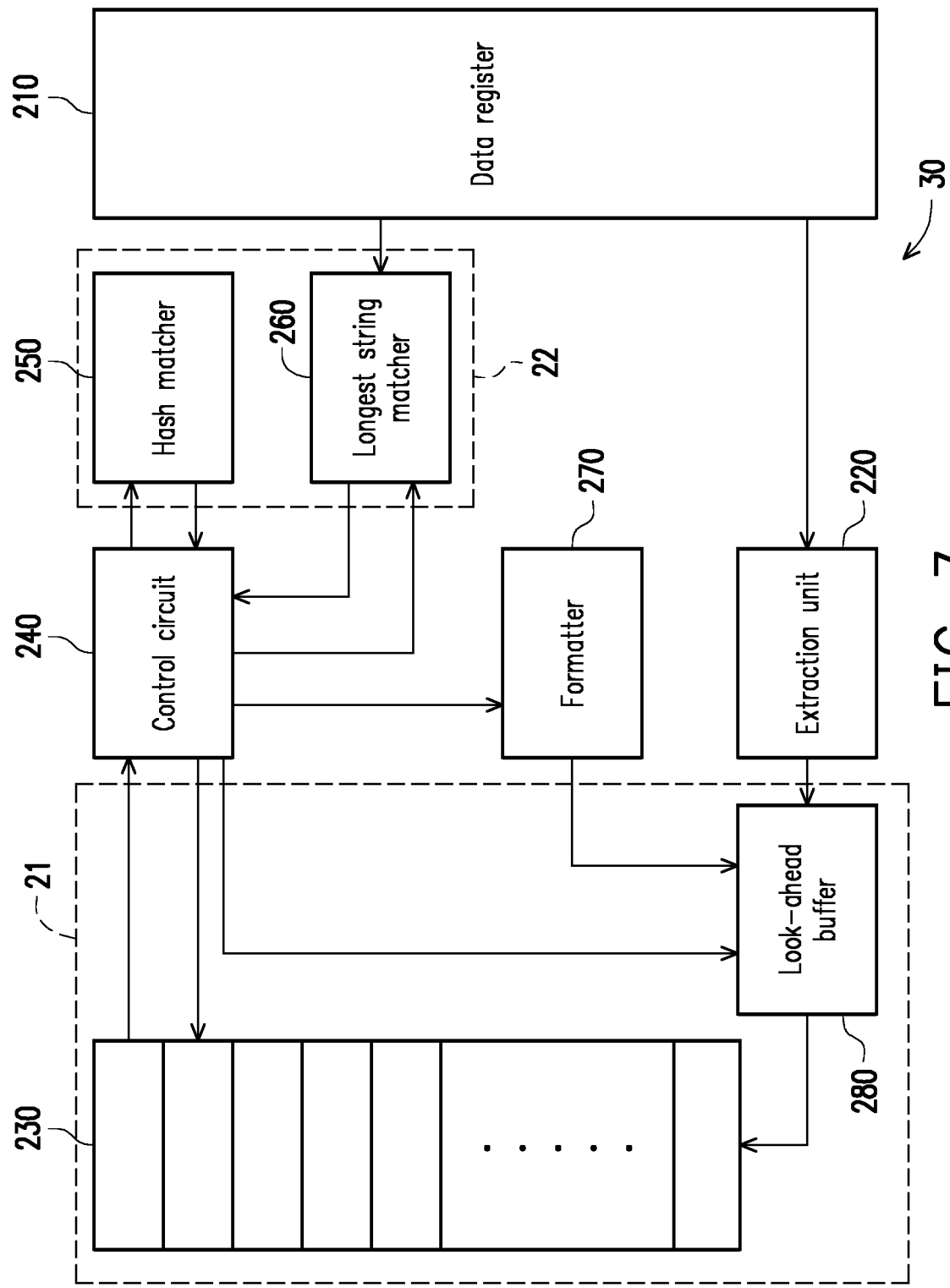
FIG. 7 is a circuit block diagram illustrating an accelerated compression apparatus according to another embodiment of the invention.

FIG. 7 is a circuit block diagram illustrating an accelerated compression apparatus 30 according to another embodiment of the invention. The accelerated compression apparatus 30 includes the intermediary buffer 230, the control circuit 240, a hash matcher 250, a longest string matcher 260, the formatter 270 and a look-ahead buffer 280. The intermediary buffer 230 and the look-ahead buffer 280 shown in FIG. 7 are equivalent to the look-ahead memory 21 shown in FIG. 2, and the hash matcher 250 and the longest string matcher 260 shown in FIG. 7 are equivalent to the string matching processing pipeline 22 shown in FIG. 2. The control circuit 240 and the formatter 270 shown in FIG. 2 can refer to the related description of the control circuit 240 and the formatter 270 shown in FIG. 7.

In another embodiment, the accelerated compression apparatus 30 further includes a data register 210. Based on design requirements, a length of the data register 210 may be 1024 M bytes or other lengths. The data register 210 is configured to store a raw string (i.e., the string to be compressed) and a compressed string. It should be noted that, in other embodiments, the data register 210 may be located in a last-level cache (e.g., the last-level cache 110 shown in FIG. 1), that is, located outside the accelerated compression apparatus 30.

In another embodiment, the accelerated compression apparatus 20 may further include an extraction unit 220. A look-ahead request may be sent to the data register 210 through the extraction unit 220, so as to extract the string to be compressed with a length fixed Q (e.g., Q is 16 bytes) from the data register 210. The extraction unit 220 can store the string to be compressed to the look-ahead buffer 280 as a target to be sent to the string matching processing pipeline 22 for the string compression. Further, the control circuit 240 further controls P instances issued in parallel from the look-ahead buffer 280 in each issue cycle. Here, each of the P instances sequentially corresponds to a sub-string using each character of consecutive P characters in the string to be compressed as a start character. Q and P are positive integers greater than 1, and Q is greater than P. In an embodiment, P may be 4 and each sub-string includes 3 characters, but the invention is not limited thereto.

In another embodiment, once being issued, the instances (the sub-string) are sequentially stored in the intermediary buffer 230. The intermediary buffer 230 stores related computing information associated with each sub-string (e.g., a hash, a longest string matching and/or other computing information). In detail, the intermediary buffer 230 divides a plurality of memory spaces, and each of which can be used to store information of one instance. Each instance includes multiple fields, and these fields are used to record an index, the start character, a state, a matched offset, a matched length of the corresponding sub-string and/or other computing information.

Since the accelerated compression apparatus 30 includes many parallel operations, the computing time (or the number of clock cycles) corresponding to each instance cannot be predicted. In other words, a computing result corresponding to the instance being issued later may be obtained earlier than a computing result corresponding to the instance issued earlier. The intermediary buffer 230 can match an output sequence of the computing results of all the instances with an original sequence of original characters to be compressed to thereby complete the longest string matching in the end. Both the look-ahead buffer 280 and the intermediary buffer 230 include the issue pointer IP and the retire pointer RP. The issue pointer IP of the look-ahead buffer 280 sequentially points to the next instance to be issued according to an original sequence of the sub-strings in the string to be compressed. Because the P instances are issued in parallel in each issue cycle, the issue pointer IP will sequentially jump backwards over P characters in each of the issue cycles. The retire pointer RP of the look-ahead buffer 280 sequentially points to the next instance to be retired according to the original sequence to the sub-strings in the string to be compressed. That is to say, the retire pointer RP can control the sub-strings of each instance to be retired according to the original sequence in the string to be compressed. Because the P instances that complete the matching operation are retired in parallel in each issue cycle, the retire pointer will sequentially jump backwards over P characters in each of the issue cycles. It should be noted that, the issue/retire pointer of the intermediary buffer 230 may be synchronized with the issue/retire pointer of the look-ahead buffer 280. In an embodiment, if the size of the look-ahead buffer 280 is, for example, 512 bytes to at most store 512 characters, its issue/retire pointer has the length of 9 bits; if the intermediary buffer 280 includes, for example, a 64-layer entry to store at most 64 instances starting from the start character, its issue/retire pointer are the lower 6 bits of the issue/retire pointer of the look-ahead buffer 280.

Initially, the extraction unit 220 extracts a plurality of original characters (the string to be compressed) from the data register 210. The extraction unit 220 extracts a plurality of sub-strings from the string to be compressed, and issues the sub-strings in parallel in form of the instance. In an embodiment, once being issued, the instances corresponding to the sub-strings are sequentially written into the intermediary buffer 230. In another embodiment, the instances corresponding to the sub-strings are sequentially written into corresponding spaces of the intermediary buffer 230 according to the original sequence in the string to be compressed only after the match result is generated. It should be noted that, the so-called "issued" refers to: when the issue pointer of the look-ahead buffer 280 points to a particular character in the look-ahead buffer 280, the sub-string with that particular character as the start character (the instance) is then being "issued".

Based on design requirements, the control circuit 240 may include a finite-state machine (FSM) and/or other control circuits/devices. For example, in some embodiments, control operations of the control circuit 240 described in this embodiment may be implemented in a programmable logic device (PLD), a programmable logic controller (PLC), a field programmable gate array (FPGA) or an application-specific integrated circuit (ASIC).

In an embodiment, the control circuit 240 can send a hash request for one instance to the hash matcher 250, so as to obtain information regarding whether the sub-string corresponding to said one instance and having a length being n can match one hash key in a hash table. In some embodiments, based on design requirements, n is 3 or more. The control circuit 240 can also send a data request for one instance to the longest string matcher 260, so as to obtain the sub-string corresponding to said one instance that can match a length of the raw string in the sliding window (the dictionary) of the data register 210. It should be noted that, the raw string in the sliding window is arranged before the raw string to be compressed in the look-ahead buffer 280, i.e., the raw string in the sliding window is the compressed string.

Figure 8:
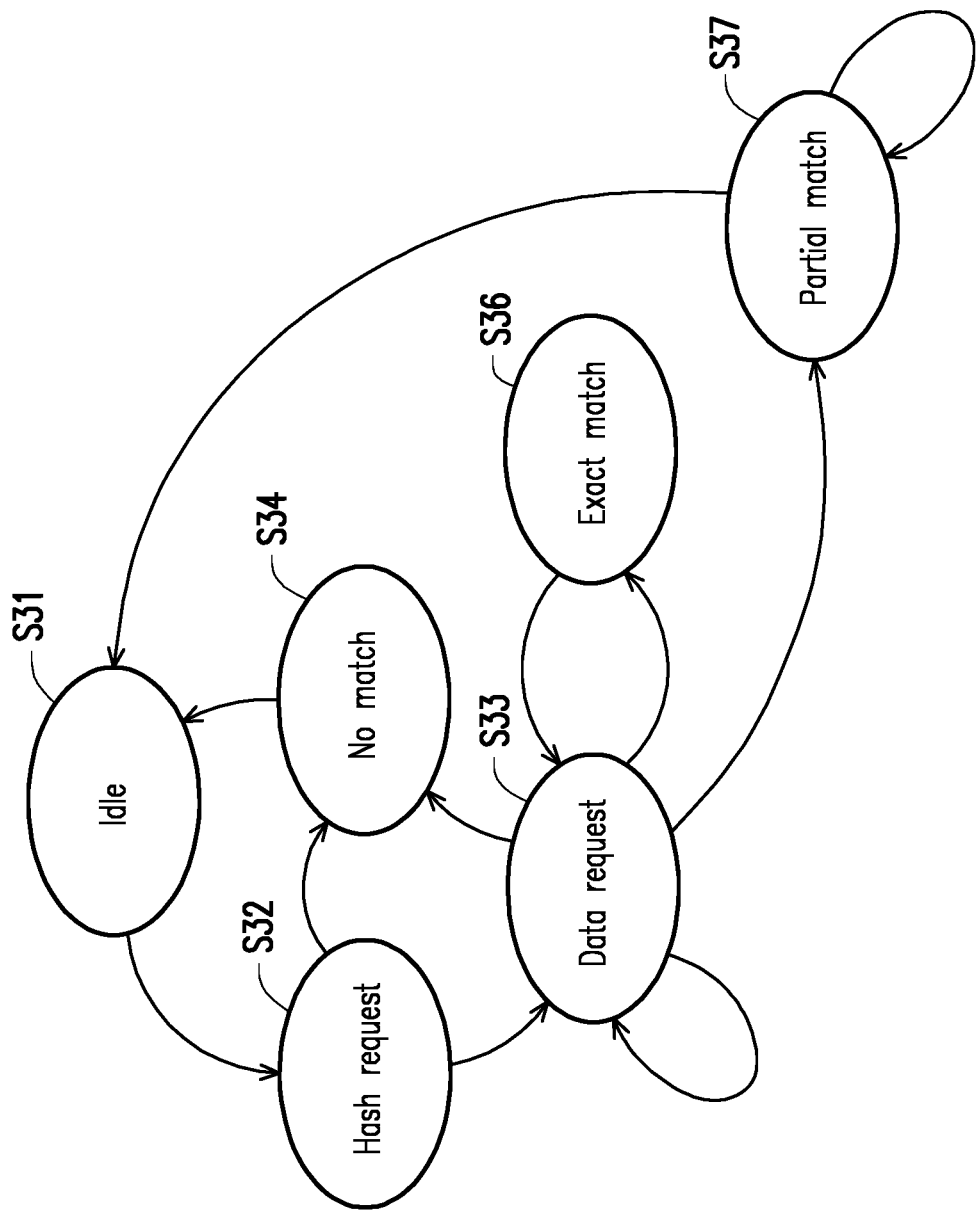
FIG. 8 illustrates a state diagram according to an embodiment of the invention.

FIG. 8 illustrates a state diagram according to an embodiment of the invention. Initially, the extraction unit 220 extracts the string to be compressed with a fixed length from the raw string of the data register 210 and stores the string to be compressed to the look-ahead buffer 280. Here, the string to be compressed includes Q characters. In an embodiment, Q is equal to 16. In an embodiment, after being issued or after the match result is generated, the instances corresponding to the sub-strings in the string to be compressed are sequentially stored to the intermediary register 230. For instance, the extraction unit 220 may extract a string to be compressed "abcdxyzefgafabc . . . " from the data register 210, and sequentially store the instances corresponding to the sub-strings being issued or after the match result is generated to the intermediary register 230. Table 1 shows initial results of the instances. Initially, the state of each instance is an idle state S31, as shown by Table 1. "/" shown in a state field of Table 1 indicates a null value.

TABLE 1

| Index | Sub-string | State | Matched length | Matched offset |
|---|---|---|---|---|
| 0 | abc | / | | |
| 1 | bcd | / | | |
| 2 | cdx | / | | |
| 3 | dxy | / | | |
| 4 | xyz | / | | |
| 5 | yze | / | | |
| 6 | zef | / | | |
| 7 | efg | / | | |
| 8 | fga | / | | |
| 9 | gaf | / | | |
| 10 | afa | / | | |
| 11 | fab | / | | |

In an embodiment, the control circuit 240 controls each instance in the string matching processing pipeline 22 so the matching operation can be performed thereto. The control circuit 240 may be implemented by a logic circuit, which controls the hash matcher 250 and the longest string matcher 260 to perform processes of the string matching operation in FIG. 9 to FIG. 12 described below, but the invention is not limited thereto.

Figure 9:
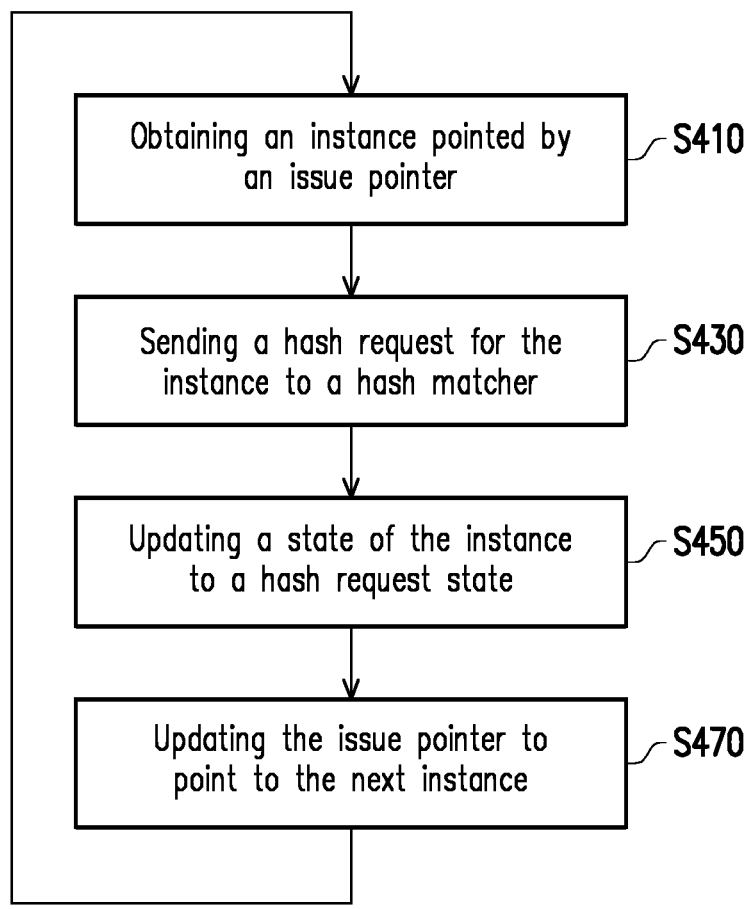
FIG. 9 illustrates a flowchart of a hash request operation according to an embodiment of the invention.

FIG. 9 is a flowchart illustrating a hash request operation according to an embodiment of the invention. In each clock cycle (issue cycle), the control circuit 240 obtains an instance pointed by the issue pointer IP (step S410), sends a hash request for the instance to the hash matcher 250 (step S430), updates the state of the instance to "HASH_ISSUED" which indicates that the instance enters a hash request state S32 (step S450), and updates the issue pointer IP to point to the next instance (step S470). The hash request contains characters of consecutive instances starting from said instance and having the length n. For example, referring to Table 1, the hash request corresponding to an instance 0 contains a sub-string "abc", the hash request corresponding to an instance 1 contains a sub-string "bcd", and so on and so forth. The sub-strings "abc" and "bcd" are sub-strings of a string "abcdxyzefgaf", and characters "a" and "b" are respectively start characters of the sub-strings "abc" and "bcd".

Figure 10:
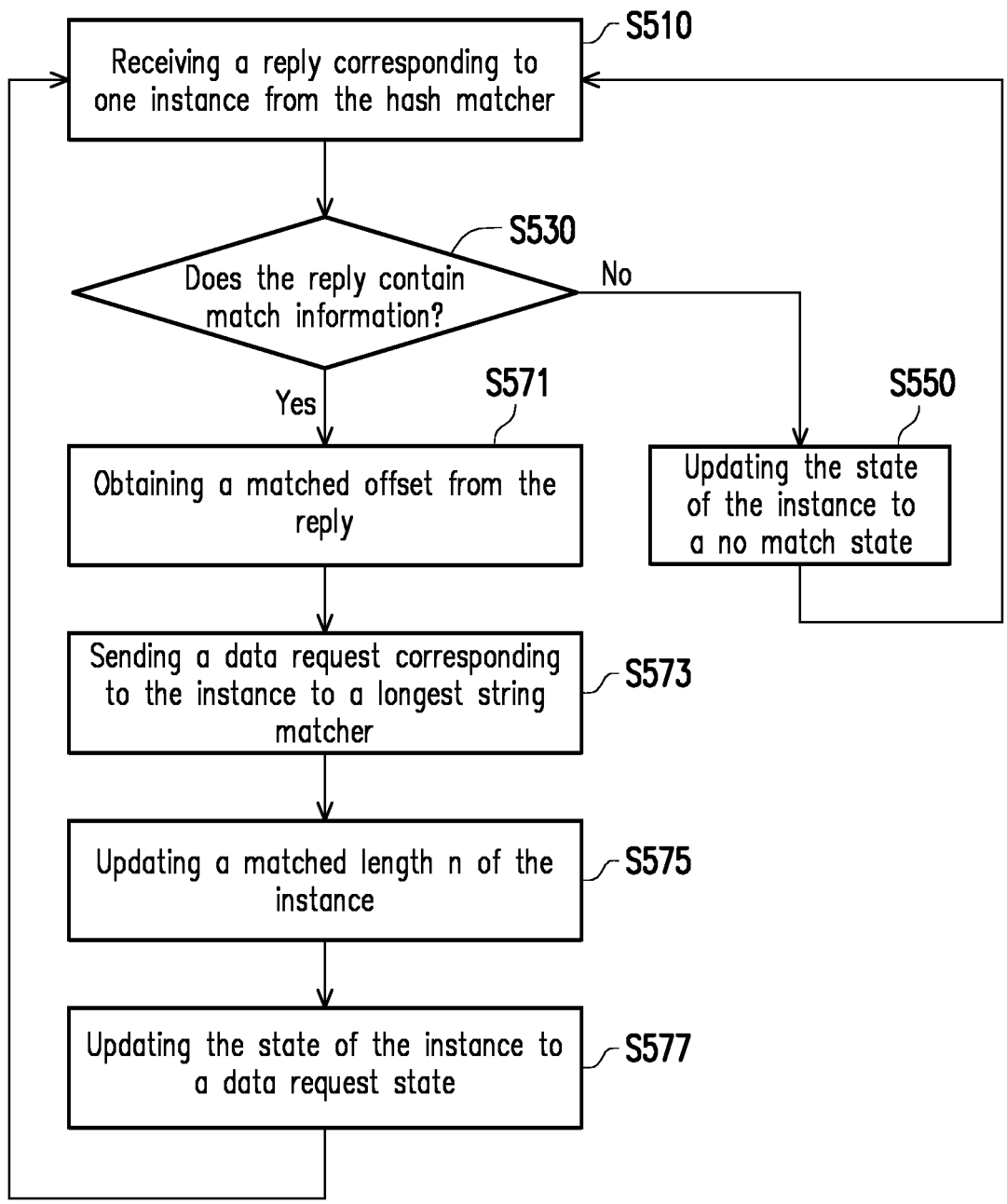
FIG. 10 illustrates a flowchart of a hash reply processing operation according to an embodiment of the invention.

FIG. 10 is a flowchart illustrating a hash reply processing operation according to an embodiment of the invention. After the control circuit 240 receives a reply corresponding to one instance from the hash matcher 250 (step S510), the control circuit 240 can determine whether the reply contains match information (step S530). In an embodiment, when the reply contains "no match" information (path of "No" in step S530), the control circuit 240 can update the state of the instance to "NM" which indicates that the instance enters a no match state S34 (step S550). The reply received from the hash matcher 250 contains the sub-string of the previous request, which allows the control circuit 240 to recognize which instance the reply corresponds to. When one instance enters the no match state S34, the control circuit 240 can reclaim the memory space of that instance for future instances in future clock cycles.

When the reply contains the "match" information (path of "Yes" in step S530), the control circuit 240 can obtain a matched offset from the reply (step S571), and send a data request corresponding to the instance to the longest string matcher 260 (step S573). Here, the data request contains aforementioned matched offset. In an embodiment, the longest string matcher 260 can search for a maximum matched length between a string starting from the sub-string corresponding to the instance in the look-ahead buffer 280 and a string starting from the matched offset in the sliding window (the dictionary) in the data register 210 in step S573. The control circuit 240 can update a matched length of the instance to n (step S575), and update the state of the instance to "DATA ISSUED" which indicates that the instance enters a data request state S33 (step S577). It should be noted that, in other embodiments, after obtaining the matched offset from the reply (step S571), the control circuit 240 may directly send the data request corresponding to the instance to the longest string matcher 260 without updating the content of the instance in the intermediary buffer 230 (i.e., without performing step S575 and step S577).

For instance, Table 2 shows updated results of the instances. After seven clock cycles (issue cycles), the control circuit 240 updates the content in each entry in the intermediary buffer 230 according to results in the replies from the hash matcher 250 and the longest string matcher 260, as shown in Table 2.

TABLE 2

| Index | Sub-string | State | Matched length | Matched offset |
|---|---|---|---|---|
| 0 | abc | NM | | |
| 1 | bcd | HASH_ISSUED | | |
| 2 | cdx | NM | | |
| 3 | dxy | NM | | |
| 4 | xyz | DATA_ISSUED | 3 | 1000 |
| 5 | yze | NM | | |
| 6 | zef | NM | | |
| 7 | efg | / | | |
| 8 | fga | / | | |
| 9 | gaf | / | | |
| 10 | afa | / | | |
| 11 | fab | / | | |

Table 2 shows that the hash requests corresponding to the instances 0 to 6 have been sent to the hash matcher 250. The control circuit 240 has received the replies corresponding to the instance 0, the instance 2, the instance 3, the instance 5, and the instance 6 including the "no match" information (i.e., all of which being "NM" (No Match)) from the hash matcher 250. That is to say, the sub-strings "abc", "cdx", "dxy", "yze" and "zef" corresponding to the instance 0, the instance 2, the instance 3, the instance 5, and the instance 6 all have "no match" in the hash matcher 250, i.e., have not appeared in the raw string in the sliding window (the dictionary) of the data register 210. The control circuit 240 has received the reply corresponding to the instance 4 (which contains the "match" information) from the hash matcher 250 and has sent the data request to the longest string matcher 260 (but has not received any reply yet). The sub-string "xyz" corresponding to the instance 4 is determined as "match" by the hash matcher 250, i.e., the sub-string "xyz" has appeared in the raw string in the sliding window of the data register 210. The control circuit 240 obtains the matched offset of the sub-string "xyz" corresponding to the instance 4 in the sliding window from the reply of the hash matcher 250. Based on the reply from the hash matcher 250, the control circuit 240 can send the data request containing the matched offset to the longest string matcher 260, so as to search for the maximum matched length between the string starting from the sub-string "xyz" corresponding to the instance 4 in the look-ahead buffer 280 and the string starting from the matched offset (1000) in the sliding window (the dictionary) in the data register 210. In addition, the control circuit 240 has not yet received any reply corresponding to the instance 1 from the hash matcher 250.

Figure 11:
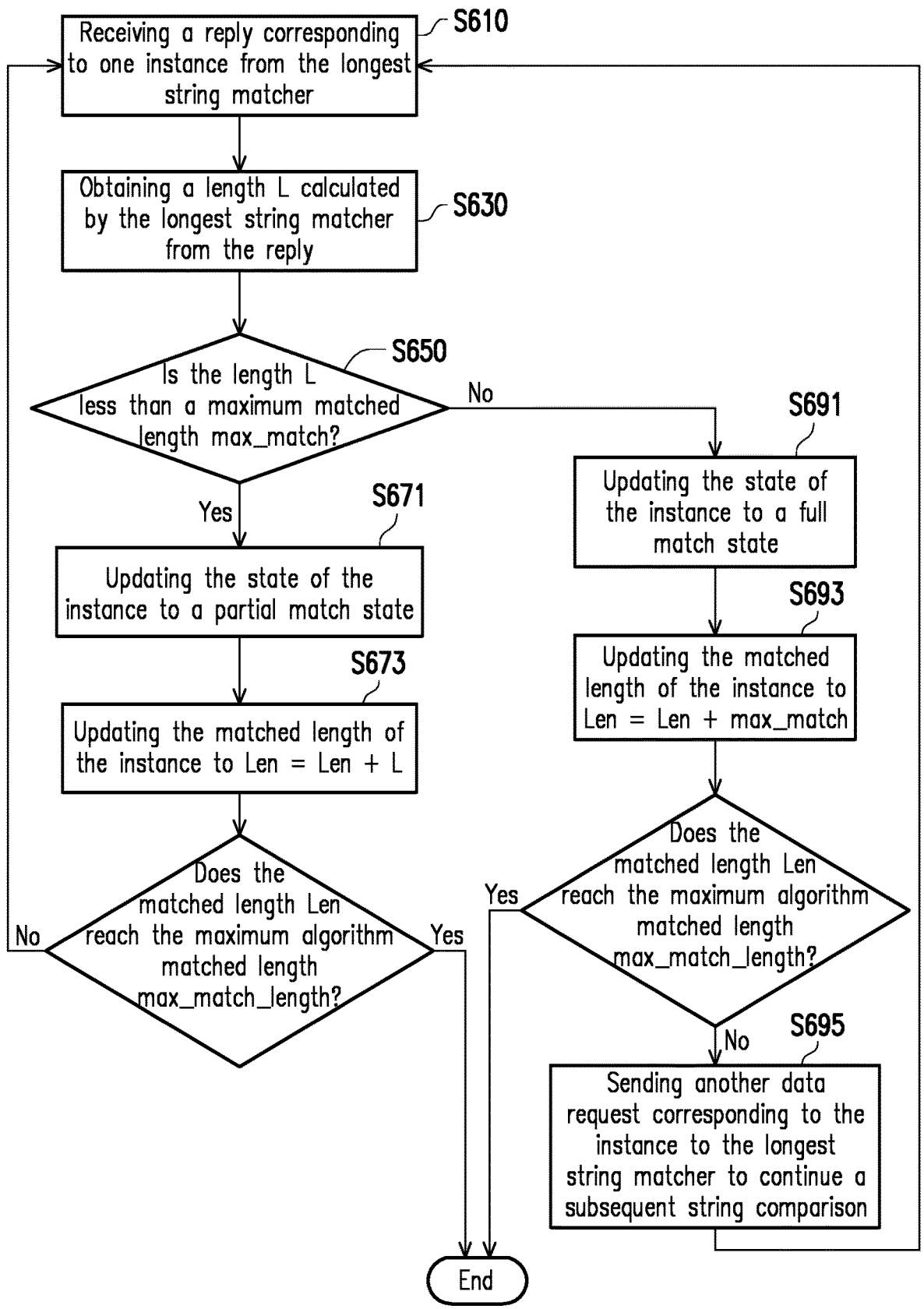
FIG. 11 illustrates a flowchart of a data reply processing operation according to an embodiment of the invention.

FIG. 11 is a flowchart illustrating a data reply processing operation according to an embodiment of the invention. After the control circuit 240 receives a reply corresponding to one instance from the longest string matcher 260 (step S610), the control circuit 240 can obtain a length L calculated by the longest string matcher 260 from the reply (step S630), determine whether the length L is less than a maximum matched length max_match (step S650), and update a state, a matched length and a matched offset of the instance according to the determination result. Specifically, in an embodiment, when the length L is less than the maximum matched length max_match (path of "Yes" in step S650), the control circuit 240 can update the state of the instance to "PM" which indicates that the instance enters a partial match state S37 (step S671), and update the matched length of the instance to Len=Len+L (step S673). When one instance enters the partial match state S37, the control circuit 240 can reclaim the memory space of that instance for future instances in future clock cycles; when the length L is not less than (which is usually equal to) the maximum matched length max_match (path of "No" in step S650), the control circuit 240 can update the state of the instance to "FM" which indicates that the instance enters a full match state (step S691), update the matched length of the instance to Len=Len+max_match (step S693), and send another data request corresponding to the instance to the longest string matcher 260 to continue a subsequent string comparison (step S695). In an embodiment, the maximum matched length max_match is 16 bytes, and a maximum algorithm matched length max_match length defined in the LZ77 series algorithm is 258 bytes. After step S673 and step S693, whether the matched length Len of the instance reaches the maximum algorithm matched length max_match length will be determined. If so, the process of FIG. 11 ends. That is to say, even if it is the full match, it will not be compared. Instead, after the maximum algorithm matched length max_match length is reached, the comparison stops. For example, in each comparison of 16 bytes, if the matched length 258 bytes has been reached, the comparison stops. It should be noted that, if step S575 of FIG. 10 for updating the content of the instance in the intermediary buffer 230 is not performed, the length n (e.g., n=3) of the sub-string corresponding to the instance needs to be further added to Len when updating the matched length in FIG. 11.

Figure 12:
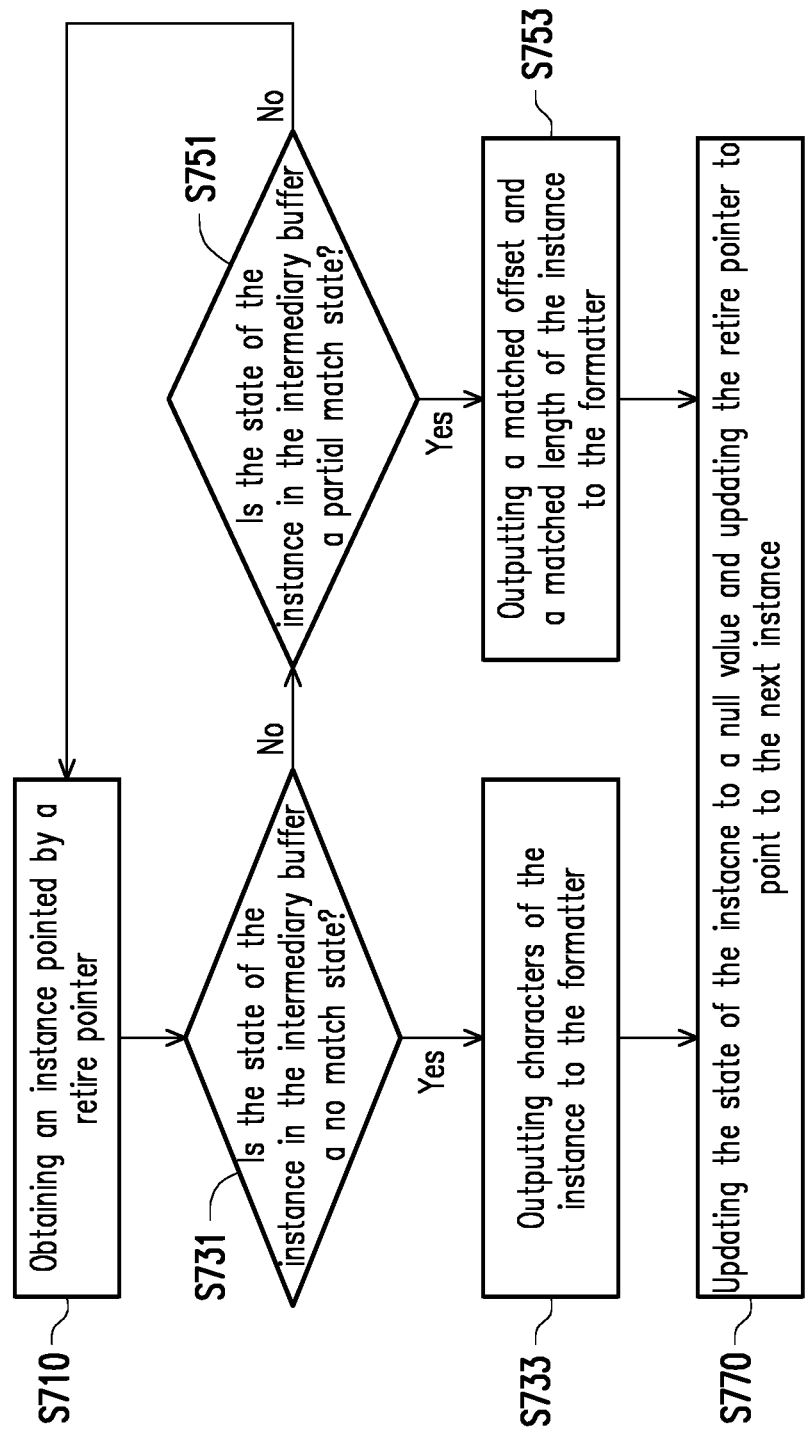
FIG. 12 illustrates a flowchart of a retirement processing operation according to an embodiment of the invention.

In one clock cycle, in addition to performing the hash request operation, the control circuit 240 further performs a retirement processing operation to follow the original order of the sub-strings of all the instances to be compressed in the string to be compressed, and according to each the status of the instances, the matched length, and the matched offset are output to the formatter 270 such that the formatter 270 compresses the prefetched string to be compressed. FIG. 12 is a flowchart illustrating a retirement processing operation according to an embodiment of the invention. In each clock cycle, the control circuit 240 obtains an instance pointed by the retire pointer RP (step S710), and determines whether the state of the instance in the intermediary buffer 230 is a no match state (step S731). When the state of the instance is the no match state (path of "Yes" in step S731), the control circuit 240 outputs the character of the instance to the formatter 270 (step S733), so that the formatter 270 can accordingly compress the string to be compressed in the look-ahead buffer 280.

When the state of the instance is not the "no match state" (path of "No" in step S731), the control circuit 240 can determine whether the state of the instance in the intermediary buffer 230 is a partial match state (step S751). When the state of the instance is the partial match state (path of "Yes" in step S751), the control circuit 240 outputs the matched offset and the matched length of the instance to the formatter 270 (step S753), so that the formatter 270 can accordingly compress the string to be compressed in the look-ahead buffer 280.

In step S733 or step S753, the formatter 270 can compress the string to be compressed by using conventional algorithms, including LZ4, LZO (Lempel-Ziv-Oberhumer), DEFLATE, etc. After step S733 or step S753 are completed, the control circuit 240 can update the state of the instance to the null value, and update the retire pointer RP to point to the next instance in step S770 (for retiring the instance so that the memory space may be provided for future instances being pushed in).

When the state of the instance is "match" but not the partial match state (path of "No" in step S751), i.e., the full match state, as described by step S691 in FIG. 11, unless the matched length Len reaches the maximum algorithm matched length max_match length, the control 240 will send another data request corresponding to the instance to the longest string matcher 260 to continue the subsequent string comparison without performing the retirement operation on the instance. Path of "No" in step S751 in FIG. 12 leads back to step S710 to continue waiting for the change of the instance state. In general, when performing the retirement processing operation in FIG. 12, the control circuit 240 outputs the match result to the formatter 270 according to the original sequence of the sub-strings associated with the instances in the string to be compressed (e.g., an sequence that the retire pointer RP is according to) in the intermediary buffer 230 and according to the state, the matched length and the matched offset of each of the instances (e.g., as shown by Table 3 to Table 5 below) in the intermediary buffer 230, so that the formatter 270 accordingly compresses the raw string to be compressed. Details regarding the above will be described below with reference to Table 3 to Table 5.

Following the example of Table 2, it is assumed that in a clock cycle T7, the issue pointer IP points to the instance 7, the retire pointer RP points to the instance 0, the maximum matched length max_match is default to 258 bytes, and the control circuit 240 receives the reply corresponding to the instance 4 from the longest string matcher 260. In the clock cycle T7, referring to FIG. 9, the control circuit 240 obtains the instance 7 pointed by the issue pointer IP (step S410); the control circuit 240 sends the hash request containing the sub-string "efg" for the instance 7 to the hash matcher 250 (step S430); the control circuit 240 updates the state of the instance 7 to "HASH_ISSUED" which indicates that the instance 7 enters the hash request state S32 (step S450); and the control circuit 240 updates the issue pointer IP to point to the instance 8 (step S470). In the clock cycle T7, referring to FIG. 12, the control circuit 240 obtains the state of the instance 0 pointed by the retire pointer RP (step S710).

Because the state of the instance 0 is the no match state, the control circuit 240 outputs the character "a" of the instance 0 to the formatter 270 (step S733) so the formatter 270 can keep the character "a" without performing compression actions. The control circuit 240 makes the sliding window in the data register 210 to move forward by one character, i.e., makes the character "a" in the data register 210 to slide into the sliding window as a part of the new dictionary. The control circuit 240 updates the state of the instance 0 to the null value "/", and updates the retire pointer RP to point to the instance 1 (step S770). Referring to FIG. 11, in the clock cycle T7, the control circuit 240 obtains the length L=2 calculated by the longest string matcher 260 from the reply corresponding to the instance 4 (step S630). Because L<max_match, the control circuit 240 updates the state of the instance 4 to "PM" which indicates that the instance 4 enters the partial match state S37 (step S671); and the control circuit 240 updates the matched length of the instance 4 to Len=3+2=5 (step S673). The states of the instants in the intermediary buffer 230 are updated to Table 3.

TABLE 3

| Index | Sub-string | State | Matched length | Matched offset |
|---|---|---|---|---|
| 0 | | / | | |
| 1 | bcd | HASH_ISSUED | | |
| 2 | cdx | NM | | |
| 3 | dxy | NM | | |
| 4 | xyz | PM | 5 | 1000 |
| 5 | yze | NM | | |
| 6 | zef | NM | | |
| 7 | efg | HASH_ISSUED | | |
| 8 | fga | / | | |
| 9 | gaf | / | | |
| 10 | afa | / | | |
| 11 | fab | / | | |

Following the example of Table 3, it is assumed that in a clock cycle T8, the control circuit 240 receives the reply corresponding to the instance 1 from the hash matcher 250. In the clock cycle T8, referring to FIG. 9, the control circuit 240 obtains the instance 8 pointed by the issue pointer IP (step S410), sends the hash request containing the sub-string "fga" for the instance 8 to the hash matcher 250 (step S430), updates the state of the instance 8 to "HASH_ISSUED" which indicates that the instance 8 enters the hash request state S32 (step S450); and updates the issue pointer IP to point to the instance 9 (step S470). Referring to FIG. 12, in the clock cycle T8, the control circuit 240 obtains the state of the instance 1 pointed by the retire pointer RP (step S710). Because the state of the instance 1 is the hash request state, the control circuit 240 does not perform any processing. Referring to FIG. 10, in the clock cycle T8, the clock cycle 240 receives the reply corresponding to the instance 1 from the hash matcher 250 (step S510). Because the reply contains the "no match" information, the control circuit 240 updates the state of the instance 1 to "NM" which indicates that the instance 1 enters the no match state S34 (step S550). The states of the instants in the intermediary buffer 230 are updated to Table 4.

TABLE 4

| Index | Sub-string | State | Matched length | Matched offset |
|---|---|---|---|---|
| 0 | abc | / | | |
| 1 | bcd | NM | | |

TABLE 4-continued

| Index | Sub-string | State | Matched length | Matched offset |
|---|---|---|---|---|
| 2 | cdx | NM | | |
| 3 | dxy | NM | | |
| 4 | xyz | PM | 5 | 1000 |
| 5 | yze | NM | | |
| 6 | zef | NM | | |
| 7 | efg | HASH_ISSUED | | |
| 8 | fga | HASH_ISSUED | | |
| 9 | gaf | / | | |
| 10 | afa | / | | |
| 11 | fab | / | | |

Following the example of Table 4, it is assumed that in a clock cycle T9, the control circuit 240 receives the reply corresponding to the instance 7 from the hash matcher 250. In the clock cycle T9, referring to FIG. 9, the control circuit 240 obtains the instance 9 pointed by the issue pointer IP (step S410), sends the hash request containing the sub-string "gaf" for the instance 9 to the hash matcher 250 (step S430), updates the state of the instance 9 to "HASH_ISSUED" which indicates that the instance 9 enters the hash request state S32 (step S450); and updates the issue pointer IP to point to the instance 10 (step S470). Referring to FIG. 12, in the clock cycle T9, the control circuit 240 obtains the state of the instance 1 pointed by the retire pointer RP (step S710). Because the state of the instance 1 is the no match state, the control circuit 240 outputs the character "b" of the instance 1 to the formatter 270 so the formatter 270 can keep the character "b" without performing compression actions (step S733). The control circuit 240 makes the sliding window in the data register 210 to move forward by one character, i.e., makes the character "b" in the data register 210 to slide into the sliding window as a part of the new dictionary. The control circuit 240 updates the state of the instance 1 to the null value "/", and updates the retire pointer RP to point to the instance 2 (step S770). In an embodiment, in the same clock cycle, because 4 instances are issued and retired in parallel, the issue pointer IP and the retire pointer RP jumps over 4 positions in each clock cycle. Referring to FIG. 10, in the clock cycle T9, the control circuit 240 receives the reply corresponding to the instance 7 from the hash matcher 250 (step S510). Because the reply contains the "no match" information, the control circuit 240 updates the state of the instance 7 to "NM" which indicates that the instance 7 enters the no match state S34 (step S550). The states of the instants in the intermediary buffer 230 are updated to Table 5.

TABLE 5

| Index | Sub-string | State | Matched length | Matched offset |
|---|---|---|---|---|
| 0 | abc | / | | |
| 1 | bcd | / | | |
| 2 | cdx | NM | | |
| 3 | dxy | NM | | |
| 4 | xyz | PM | 5 | 1000 |
| 5 | yze | NM | | |
| 6 | zef | NM | | |
| 7 | efg | NM | | |
| 8 | fga | HASH_ISSUED | | |
| 9 | gaf | HASH_ISSUED | | |
| 10 | afa | / | | |
| 11 | fab | / | | |

The following description refers to FIG. 12. After a period of time, for example, in a clock cycle T12, the control circuit 240 obtains the state of the instance 4 pointed by the retire pointer RP (step S710). It should be noted that before this step, because the characters "c" and "d" in the string to be compressed in the look-ahead buffer 280 have no match, the characters "c" and "d" are kept without the compression action performed, and the characters "c" and "d" in the data register 210 have already been slid into the sliding window as a part of the new dictionary. In the clock cycle T12, because the state of the instance 4 is the partial match state, the control circuit 240 outputs the matched offset (e.g., 1000) and the matched length (e.g., 5) of the instance 4 to the formatter 270 so the formatter 270 can accordingly compress the raw string to be compressed in the look-ahead buffer 280. Because the state of the instant 4 is the partial match state and the matched length is 5, the characters "xyzef" in the look-ahead buffer 280 is replaced by a match pair (1000, 5) and the sliding window in the data register 210 is moved forward by 5 characters (i.e., the characters "xyzef" in the data register 210 are slid into the sliding window as a part of the new dictionary).

It should be noted that, as shown in the above example, although the control circuit 240 sends the corresponding hash request to initiate the compression operation according to the sequence of the instances, each instance may not be able to enter the no matched state S34 or the partial match state S37 according to the original sequence since the computing times of the hash matcher 250 and the longest string matcher 260 cannot be predicted. Even though each instance may not be able to enter the no match state S34 or the partial match state S37 according to the original sequence, through the embodiments described above, the control circuit 240 can still output the computing results corresponding to the instances of the hash matcher 250 and the longest string matcher 260 to the formatter 270 according to the retire pointer RP and according to the original sequence of the sub-strings corresponding to the instances in the string to be compressed in the look-ahead buffer 280.

Figure 13:
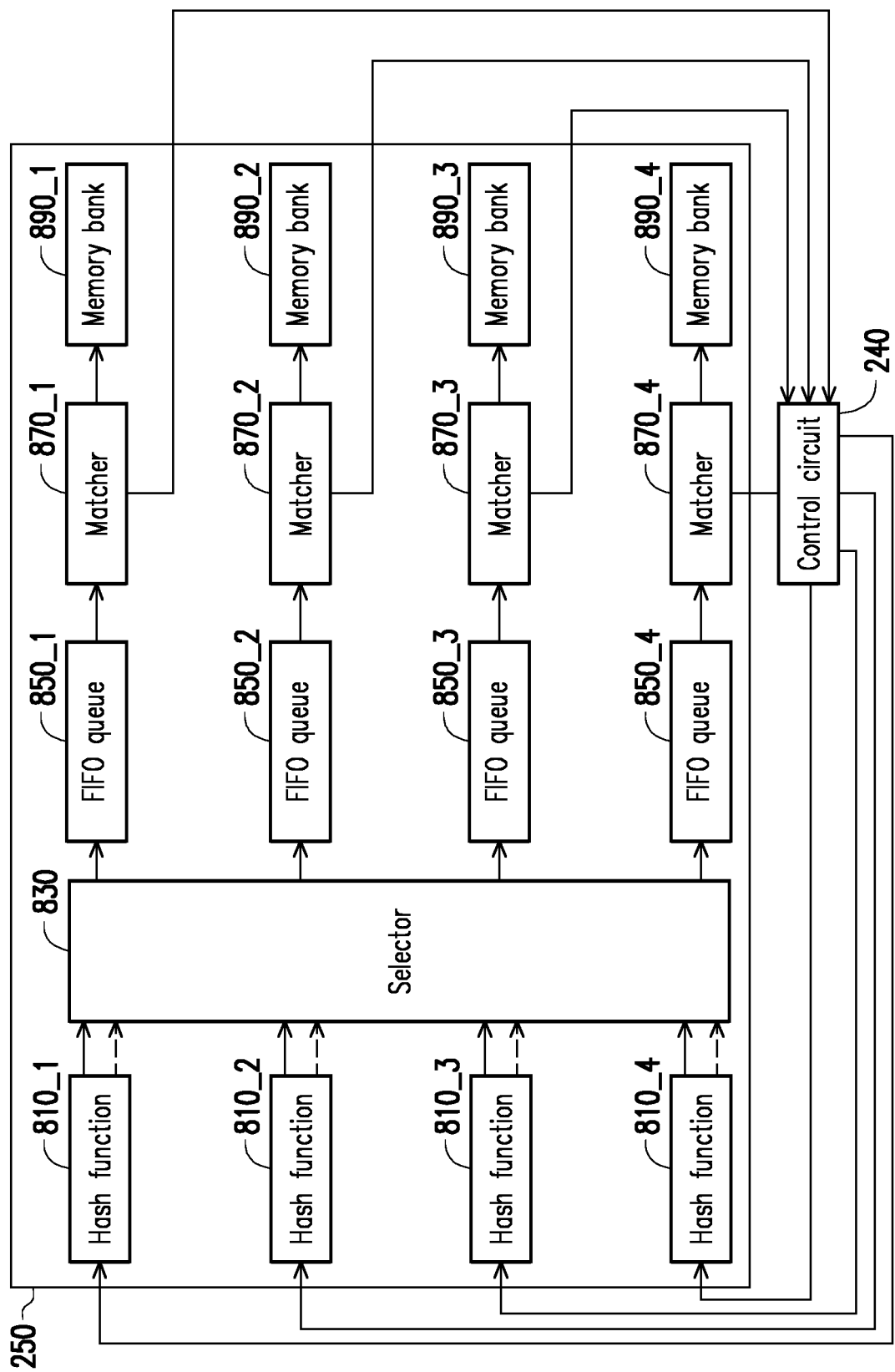
FIG. 13 is a circuit block diagram illustrating the hash matcher shown in FIG. 2 according to an embodiment of the invention.

FIG. 13 is a circuit block diagram illustrating the hash matcher 250 in the string matching processing pipeline 290 shown in FIG. 7 according to an embodiment of the invention. To accelerate a hash matching, the hash matcher 250 may include a plurality of matching paths for a parallel processing, and each of the paths includes a first in first out (FIFO) queue, a matcher and a memory bank. For example, a first matching path includes a FIFO queue 850_1, a matcher 870_1 and a memory bank 890_1; a second matching path includes a FIFO queue 850_2, a matcher 870_2 and a memory bank 890_2; a third matching path includes a FIFO queue 850_3, a matcher 870_3 and a memory bank 890_3; and a fourth matching path includes a FIFO queue 850_4, a matcher 870_4 and a memory bank 890_4. Any one of hash functions 810_1, 810_2, 810_3 and 810_4 can map the sub-string corresponding to one instance transmitted from the control circuit 240 to a hash index, and drive a selector 830 according to the hash index to connect to one corresponding matching path among the matching paths so the sub-string may be transmitted to the corresponding matching path. It should be noted that, the hash functions 810_1, 810_2, 810_3 and 810_4 execute the same hash calculation. When the corresponding matching path determines that the hash table does not include the sub-string, the corresponding matching path will transmit the "no match" information to the control circuit 240. If the hash table includes the sub-string, it means that the sub-string does exist in the sliding window in the data register 210. For example, if the hash table includes the sub-string "xyz" corresponding to the instance 4, it means that the sub-string "xyz" does exist in the sliding window in the data register 210. When the corresponding matching path determines that the hash table does include the sub-string, the corresponding matching path transmits the "match" information and the matched offset corresponding to the sub-string in the hash table to the control circuit 240.

Although the embodiment of the invention is described using four sets of matching paths as an example, based on design requirements, those skilled in the art can dispose more or fewer matching paths in the hash matcher 250, which are not particularly limited by the invention. The hash table is divided into four parts according to upper two bits of the hash index (i.e., a hash table address), and stored in the four memory banks 890_1 to 890_4, respectively. The memory banks 890_1 to 890_4 may be implemented by using cache memories. The hash table includes N entries. The memory bank 890_1 stores the 0th to ((N/4)−1)th entries; the memory bank 890_2 stores the (N/4)th to ((N/2)−1)th entries; the memory bank 890_3 stores the (N/2)th to ((3N/4)−1)th entries; and the memory bank 890_4 stores the (3N/4)th to (N−1)th entries. That is to say, the hash table is distributed according to upper two bits of the hash table address. In other implementations, the hash table may also be distributed according to lower two bits of the hash table address or other bits of the hash table address. In this embodiment, each entry can include information regarding a plurality of (e.g., three) hashed keys, and these three hash keys have the same hash index to form a hash chain. For instance, when n is 3 and data in each entry is stored using 16 bytes, the data structure is as shown by Table 6.

TABLE 6

| Address | Name | Description |
| --- | --- | --- |
| Byte[0] | Tag | A tag |
| Byte[1:3] | Hash_Key_1 | First hash key |
| Byte[4:5] | Hash_Offset_1 | First hash offset |
| Byte[6:8] | Hash_Key_2 | Second hash key |
| Byte[9:10] | Hash_Offset_2 | Second hash offset |
| Byte[11:13 AM] | Hash_Key_3 | Third hash key |
| Byte[2:15 PM] | Hash_Offset_3 | Third hash offset |

The 0th bytes of each entry stores a tag "Tag", and use three bits at fixed positions to indicate whether the three hash keys in the entry are valid, respectively. For example, the three bits "100" indicates that the first hash key is valid while the second and the third hash keys are invalid, the three bits "110" indicates that the first and the second hash keys are valid and the third hash key is invalid, and so on and so forth. The 1st to the 3rd bytes of each entry store a first hash key "Hash_Key_1" associated with one hashed index which indicates that the raw string in the sliding window includes the sub-string corresponding to the first hash key "Hash_Key_1". The 4th to the 5th bytes of each entry store a first hash offset "Hash_Offset_1" associated with the first hash key which represents an offset of the sub-string corresponding to the first hash key included in the raw string in the sliding window. The 6th to the 8th bytes of each entry store a second hash key "Hash_Key_2" associated with the same hashed index which indicates that the raw string in the sliding window includes the sub-string corresponding to the second hash key "Hash_Key_2". The 9th to the 10th bytes of each entry store a second hash offset "Hash_Offset_2" associated with the second hash key which represents an offset of the sub-string corresponding to the second hash key included in the raw string in the sliding window. The 11th to the 13th bytes of each entry store a third hash key "Hash_Key_3" associated with the same hashed index which indicates that the raw string in the sliding window includes the sub-string corresponding to the third hash key "Hash_Key_3". The 14th to the 15th bytes of each entry store a third hash offset "Hash_Offset_3" associated with the third hash key which represents an offset of the sub-string corresponding to the third hash key included in the raw string in the sliding window. Those skilled in the art can change the content of each entry based on design requirements to store more or fewer hash keys and the associated hash offsets, which are not particularly limited by the invention.

To accelerate the hash matching, the hash matcher 250 can include the four hash functions 810_1 to 810_4. The hash functions 810_1 to 810_4 perform the same algorithm to map any sub-string to a hash index with a fixed length. The length of the hash index is less than the length of the sub-string. The control circuit 240 can simultaneously output four hash requests to the hash functions 810_1 to 810_4 in a one-to-one manner in the same clock cycle (issue cycle) by a 4-issue method. That is to say, in each issue cycle, the issue pointer of the look-ahead buffer 280 sequentially jumps backwards four characters, and the control circuit 240 issues four characters from the look-ahead buffer 280 as sub-strings (instances) of the start character according to the issue pointer. One of the hash functions 810_1 to 810_4 drives the selector 830 to connect itself to one of the FIFO queues 850_1 to 850_4 according to the mapped hash index, so as to push the hash request into the connected FIFO queue. For example, when the hash function 810_1 maps/converts the sub-string "abc" to a hash index "0", the hash function 810_1 can drive the selector 830 to connect the hash function 810_1 to the FIFO queue 850_1 so the hash function 810_1 can push the hash request into the FIFO queue 850_1. It should be noted that, the pushed hash request includes the string generated by the control circuit 240 and the hash index generated corresponding to the hash function.

The hash matcher 250 may include the four parallel processed matchers 870_1 to 870_4. The matcher 870_1 is connected between the FIFO queue 850_1 and the memory bank 890_1. The matcher 870_2 is connected between the FIFO queue 850_2 and the memory bank 890_2. The matcher 870_3 is connected between the FIFO queue 850_3 and the memory bank 890_3. The matcher 870_4 is connected between the FIFO queue 850_4 and the memory bank 890_4. Any one of the matchers 870_1 to 870_4 can obtain the first hash request being entered from the connected FIFO queue, search for the entry matching the hash index in the hash request from the connected memory bank, and determine whether the valid hash key exists by checking the tag of the searched entry. When the valid hash key does not exist, the matcher determines that the entry matching the hash index in the hash request is not found, and replies to the control circuit 240 with the "no match" information for the string in the hash request. When the valid hash key does exist, the matcher further determines whether there is any valid hash key identical to the string in the hash request. When all the valid hash keys are different from the string in the hash request, the matcher replies to the control circuit 240 with the "no match" information for the string in the hash request. When there is one valid hash key identical to the string in the hash request, the matcher replies to the control circuit 240 with the "match" information for the string in the hash request and the hash offset associated with that hash key.

Figure 14:
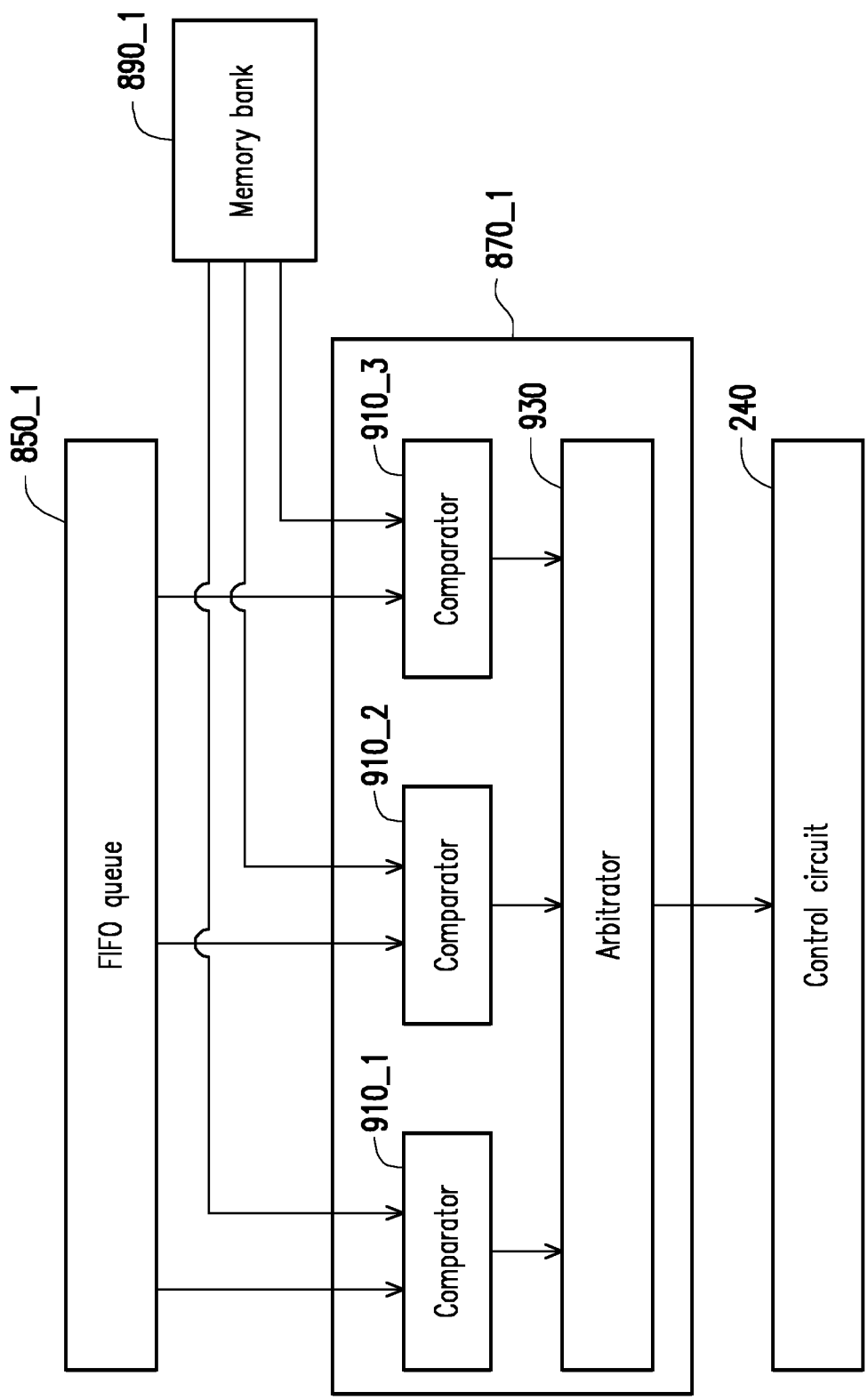
FIG. 14 is a circuit block diagram illustrating the matcher shown in FIG. 13 according to an embodiment of the invention.

FIG. 14 is a circuit block diagram illustrating the matcher 870_1 shown in FIG. 13 according to an embodiment of the invention. Although the embodiment shown in FIG. 14 is exemplified by the matcher 870_1, those skilled in the art can derive the implementation details of the matchers 870_2 to 870_4 shown in FIG. 13 according to the related description of FIG. 14. In the embodiment shown in FIG. 14, the matcher 870_1 includes a comparator 910_1, a comparator 910_2, a comparator 910_3 and an arbitrator 930. The comparator 910_1 obtains the string in the hash request from the FIFO queue 850_1 and obtains the first hash key and the first hash offset of the corresponding entry from the memory bank 890_1. The comparator 910_1 determines whether the string is identical to the first hash key. When the string is identical to the first hash key, the comparator 910_1 outputs the first hash offset to the arbitrator 930. The comparator 910_2 obtains the string in the hash request from the FIFO queue 850_1 and obtains the second hash key and the second hash offset of the corresponding entry from the memory bank 890_1. The comparator 910_2 determines whether the string is identical to the second hash key. When the string is identical to the second hash key, the comparator 910_2 outputs the second hash offset to the arbitrator 930. The comparator 910_3 obtains the string in the hash request from the FIFO queue 850_1 and obtains the third hash key and the third hash offset of the corresponding entry from the memory bank 890_1. The comparator 910_3 determines whether the string is identical to the third hash key. When the string is identical to the third hash key, the comparator 910_3 outputs the third hash offset to the arbitrator 930.

When the arbitrator 930 does not receive any hash offset from the comparators 910_1 to 910_3, the arbitrator 930 replies to the control circuit 240 with the "no match" information for the string in the hash request. When the arbitrator 930 receives one hash offset from the comparators 910_1 to 910_3, the arbitrator 930 replies to the control circuit 240 with the "match" information for the string in the hash request and the received hash offset. When the arbitrator 930 receives two or more hash offsets from the comparators 910_1 to 910_3, the arbitrator 930 replies to the control circuit 240 with the "match" information for the string in the hash request and a smallest value of the received hash offsets.

For instance, for the sub-string "abc" in the hash request, when the hash index "0" is mapped (or calculated) by the hash function 810_1, the entry corresponding to the hash index "0" in the corresponding memory bank 890_1 includes three hash keys and their hash offsets, which are: the first hash key "abc" (the hash offset is 50), the second hash key "xyz" (the hash offset is 100), and the third hash key "abc" (the hash offset is 200). It should be noted that, although key values of the hash keys "abc" and "xyz" are different, however, it is possible that the hash indexes mapped (or calculated) by the hash function 810_1 are identical due to the operation rule of the hash function. For example, the hash indexes of the hash keys "abc" and "xyz" here are both "0". Further, the two identical hash keys "abc" indicate that the sub-string "abc" appears twice at different offset positions in the raw string in the sliding window, but their hash offsets are different. Because the first hash key "abc" and the third hash key "abc" are both identical to the string "abc" in the hash request, the comparator 910_1 and the comparator 910_3 will respectively output the first hash offset (50) and the third hash offset (200) to the arbitrator 930. At this time, the arbitrator 930 will reply to the control circuit 240 with the match information for the string "abc" and the smaller hash offset 50. It should be noted that in other embodiments, when each entry of the hash table in the memory bank has multiple matches as described above (i.e., the hash keys are "abc"), the arbitrator 930 will reply to the control circuit 240 with the match information for the string in the hash request, and pushes all the matched hash offsets to the control circuit 240.

In this embodiment, in each issue cycle, the issue pointer of the look-ahead buffer 280 sequentially jumps backwards P characters, and the control circuit 240 issues P characters from the look-ahead buffer 280 as sub-strings (instances) of the start character according to the issue pointer. Further, the control circuit 240 can simultaneously output R hash requests to multiple hash functions in the same clock cycle for performing the hash matching in parallel. With the state, the matched length, and the matched offset of each instance recorded by the intermediary buffer of the embodiment, after the out-of-order execution of the hash matching and longest matching, the instances can still be retired for compression according to the original sequence in the string to be compressed. When there are a large number of repeating characters in the string to be compressed, it is possible that P and R are not equal, and details regarding the same is not specifically discussed herein.

Figure 15:
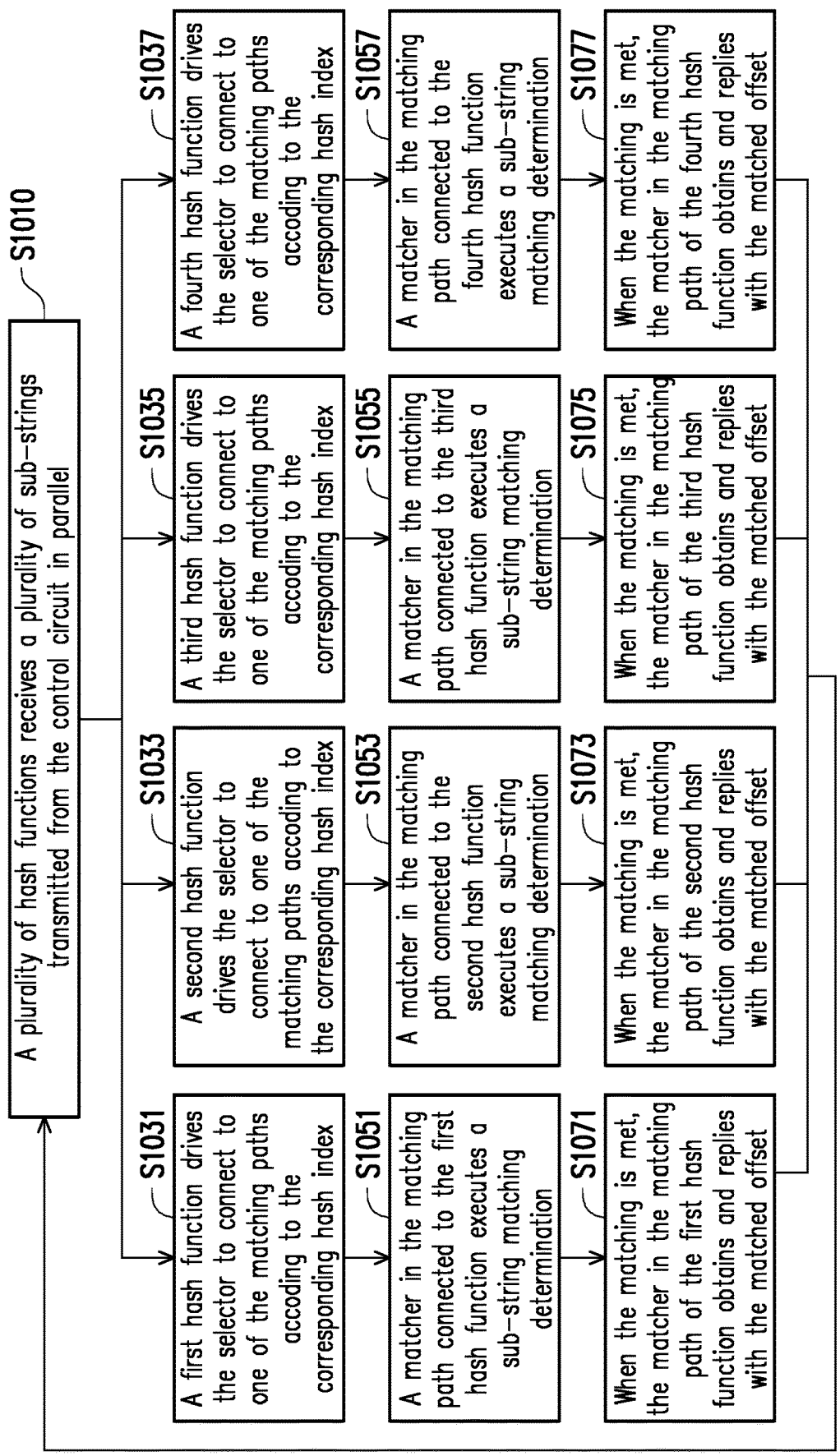
FIG. 15 is a flowchart illustrating a hash matching method according to an embodiment of the invention.

FIG. 15 is a flowchart illustrating a hash matching method according to an embodiment of the invention. With reference to FIG. 13 and FIG. 15, the hash functions 810_1 to 810_4 receive a plurality of sub-strings transmitted from the control circuit 240 in parallel (step S1010). Next, the hash function 810_1 maps the received sub-string to the hash index, and drives the selector 830 to connect itself to one of the matching paths according to the hash index (step S1031). The hash function 810_2 maps the received sub-string to the hash index, and drives the selector 830 to connect itself to one of the matching paths according to the hash index (step S1033). The hash function 810_3 maps the received sub-string to the hash index, and drives the selector 830 to connect itself to one of the matching paths according to the hash index (step S1035). The hash function 810_4 maps the received sub-string to the hash index, and drives the selector 830 to connect itself to one of the matching paths according to the hash index (step S1037). It should be noted here that in steps S1031, S1033, S1035, S1037, at least two of the hash functions 810_1 to 810_4 may be connected to the same matching path, and may push the hash requests including the sub-strings into the FIFO queue in the same matching path.

Next, when determining that the hash table does not include the sub-string received by the hash function 810_1 (step S1051), the matcher (e.g., the matchers 870_1, 870_2, 870_3 or 870_4) in the matching path connected to the hash function 810_1 transmits the "no match" information to the control circuit 240. Next, when determining that the hash table includes the sub-string received by the hash function 810_1 (step S1051), the matcher in the matching path connected to the hash function 810_1 transmits the "match" information and the matched offset corresponding to the sub-string in the hash table to the control circuit 240 (step S1071). When determining that the hash table does not include the sub-string received by the hash function 810_2 (step S1053), the matcher (e.g., the matchers 870_1, 870_2, 870_3 or 870_4) in the matching path connected to the hash function 810_2 transmits the "no match" information to the control circuit 240. When determining that the hash table includes the sub-string received by the hash function 810_2 (step S1053), the matcher in the matching path connected to the hash function 810_2 transmits the "match" information and the matched offset corresponding to the sub-string in the hash table to the control circuit 240 (step S1073). When determining that the hash table does not include the sub-string received by the hash function 810_3 (step S1055), the matcher (e.g., the matchers 870_1, 870_2, 870_3 or 870_4) in the matching path connected to the hash function 810_3 transmits the "no match" information to the control circuit 240. When determining that the hash table includes the sub-string received by the hash function 810_3 (step S1055), the matcher in the matching path connected to the hash function 810_3 transmits the "match" information and the matched offset corresponding to the sub-string in the hash table to the control circuit 240 (step S1075). When determining that the hash table does not include the sub-string received by the hash function 810_4 (step S1057), the matcher (e.g., the matchers 870_1, 870_2, 870_3 or 870_4) in the matching path connected to the hash function 810_4 transmits the "no match" information to the control circuit 240. When determining that the hash table includes the sub-string received by the hash function 810_4 (step S1057), the matcher in the matching path connected to the hash function 810_4 transmits the "match" information and the matched offset corresponding to the sub-string in the hash table to the control circuit 240 (step S1077).

It should be noted here that when the FIFO queue of one matching path contains two or more hash requests, the matcher of that matching path performs aforementioned determination according to a sequence in which the hash requests arrive. For example, when the FIFO queue of one matching path includes the hash requests of the hash functions 810_1 and 810_2 and the hash request of the hash function 810_1 arrives earlier, the execution of steps S1031, S1051 and S1071 is earlier than the execution of steps S1033, S1053 and S1073.

Based on different design requirements, blocks of the extraction unit 220, the intermediary buffer 230, the control circuit 240, the string matching processing pipeline 22 (e.g., including the hash matcher 250 and the longest string matcher 260), the formatter 270 and/or the look-ahead buffer 280 may be implemented in form of hardware, firmware, software or a combination of the three.

In form of hardware, the blocks of the extraction unit 220, the intermediary buffer 230, the control circuit 240, the string matching processing pipeline 22 (e.g., including the hash matcher 250 and the longest string matcher 260), the formatter 270 and/or the look-ahead buffer 280 may be implemented as logical circuits on an integrated circuit. Related functions of the extraction unit 220, the intermediary buffer 230, the control circuit 240, the string matching processing pipeline 22 (e.g., including the hash matcher 250 and the longest string matcher 260), the formatter 270 and/or the look-ahead buffer 280 may be implemented in form of hardware by using hardware description languages (e.g., Verilog HDL or VHDL) or other suitable programming languages. For instance, the related functions of the extraction unit 220, the intermediary buffer 230, the control circuit 240, the string matching processing pipeline 22 (e.g., including the hash matcher 250 and the longest string matcher 260), the formatter 270 and/or the look-ahead buffer 280 may be implemented as various logic blocks, modules and circuits in one or more controllers, a microcontroller, a microprocessor, an application-specific integrated circuits (ASIC), a digital signal processors (DSP), a field programmable gate array (FPGA) and/or other processing units.

In form of software/firmware, the related functions of the extraction unit 220, the intermediary buffer 230, the control circuit 240, the string matching processing pipeline 22 (e.g., including the hash matcher 250 and the longest string matcher 260), the formatter 270 and/or the look-ahead buffer 280 may be implemented as programming codes. For example, the related functions of the extraction unit 220, the intermediary buffer 230, the control circuit 240, the string matching processing pipeline 22 (e.g., including the hash matcher 250 and the longest string matcher 260), the formatter 270 and/or the look-ahead buffer 280 may be implemented by using common programming languages (e.g., C or C++) or other suitable programming languages. The programming codes may be recorded/stored in a recording medium. The recording medium includes, for example, a read only memory (ROM), a storage device and/or a random access memory (RAM). A computer, a central processing unit (CPU), a controller, a microcontroller or a microprocessor can read and execute the programming codes from the recording medium to achieve the related functions. A "non-transitory computer readable medium" (including a tape, a disk, a card, a semiconductor memory, a programmable logic circuits, etc.) may be used as the recording medium. Moreover, the programming codes may also be provided to the computer (or the CPU) via any transmission medium (a communication network or a broadcast wave). The communication network is, for example, Internet, a wired communication, a wireless communication or other communication media.

In summary, the accelerated compression apparatus described in various embodiments of the invention can check the matched length ML and the issue pointer IP during the retirement. When the new retiring position RP' associated with the matched length ML exceeds the issuing position pointed by the issue pointer IP, the control circuit 240 can reset the string matching processing pipeline 22, so as to release calculation resources and related memory spaces of the string matching processing pipeline 22 as soon as possible. In this way, the accelerated compression apparatus described in various embodiments of the invention can reduce the redundant calculation.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. An accelerated compression method, implemented in an accelerated compression apparatus comprising a look-ahead memory and a string matching processing pipeline, the accelerated compression method comprising:
    issuing at least one sub-string from a string to be compressed stored in the look-ahead memory according to an issue pointer;
    sending the at least one sub-string to the string matching processing pipeline for a matching operation to obtain at least one matched length and at least one matched offset of the at least one sub-string;
    determining a new retiring position according to a retire pointer and the matched length corresponding to a retiring position in the string to be compressed pointed by the retire pointer; and
    resetting the string matching processing pipeline when the new retiring position exceeds an issuing position in the string to be compressed pointed by the issue pointer.

2. The accelerated compression method according to claim 1, wherein when the new retiring position exceeds the issuing position in the string to be compressed pointed by the issue pointer, the accelerated compression method further comprises:
    changing the issue pointer from pointing to the issuing position to pointing to the new retiring position.

3. The accelerated compression method according to claim 1, further comprising:
    outputting a result to a formatter according to the retire pointer and according to the matched length and the matched offset corresponding to the retiring position so that the formatter accordingly compresses the string to be compressed; and
    changing the retire pointer from pointing to the retiring position to pointing to the new retiring position after outputting the result to the formatter.

4. The accelerated compression method according to claim 1, wherein each character in the string to be compressed corresponds to a flag, and the accelerated compression method further comprises:
    setting the flag corresponding to each character between the new retiring position and the retiring position when the new retiring position does not exceed the issuing position; and
    stopping the string matching processing pipeline from processing the sub-string when the flag corresponding to a start character of the sub-string processed by the string matching processing pipeline is set.

5. The accelerated compression method according to claim 1, further comprising:
    recording the new retiring position when the new retiring position does not exceed the issuing position; and
    stopping the string matching processing pipeline from processing the sub-string when a starting position of the sub-string processed by the string matching processing pipeline does not exceed the new retiring position.

6. The accelerated compression method according to claim 5, further comprising:
    not stopping the string matching processing pipeline from processing the sub-string when the starting position of the sub-string processed by the string matching processing pipeline exceeds the new retiring position.

7. The accelerated compression method according to claim 5, further comprising:
    storing all the issued sub-strings to an intermediary buffer, wherein the starting position of the sub-string processed by the string matching processing pipeline is stored in an entry corresponding to the sub-string in the intermediary buffer.

8. The accelerated compression method according to claim 1, further comprising:
    checking a distance between the new retiring position and the issuing position when the new retiring position does not exceed the issuing position; and
    resetting the string matching processing pipeline and changing the issue pointer from pointing to the issuing position to pointing to the new retiring position when the distance is less than a threshold distance.

9. The accelerated compression method according to claim 1, further comprising:
    storing all the issued sub-strings to an intermediary buffer, wherein the sub-string corresponding to characters between positions pointed by the retire pointer and the issue pointer in the intermediary buffer is the sub-string currently processed in the string matching processing pipeline.

10. An accelerated compression apparatus, comprising:
a string matching processing pipeline;
a look-ahead memory; and
a control circuit, coupled to the string matching processing pipeline and the look-ahead memory, wherein
the control circuit issues at least one sub-string from a string to be compressed stored in the look-ahead memory according to an issue pointer;
the control circuit sends the at least one sub-string to the string matching processing pipeline for a matching operation to obtain at least one matched length and at least one matched offset of the at least one sub-string;
the control circuit determines a new retiring position according to a retire pointer and the matched length corresponding to a retiring position in the string to be compressed pointed by the retire pointer; and
the control circuit resets the string matching processing pipeline when the new retiring position exceeds an issuing position in the string to be compressed pointed by the issue pointer.

11. The accelerated compression apparatus according to claim 10, wherein the control circuit further changes the issue pointer from pointing to the issuing position to pointing to the new retiring position when the new retiring position exceeds the issuing position in the string to be compressed pointed by the issue pointer.

12. The accelerated compression apparatus according to claim 10, wherein
the control circuit outputs a result to a formatter according to the retire pointer and according to the matched length and the matched offset corresponding to the retiring position so that the formatter accordingly compresses the string to be compressed; and
the control circuit changes the retire pointer from pointing to the retiring position to pointing to the new retiring position after the control circuit outputs the result to the formatter.

13. The accelerated compression apparatus according to claim 10, wherein
each character in the string to be compressed corresponds to a flag;
the control circuit sets the flag corresponding to each character between the new retiring position and the retiring position when the new retiring position does not exceed the issuing position; and
the string matching processing pipeline stops processing the sub-string when the flag corresponding to a start character of the sub-string processed by the string matching processing pipeline is set.

14. The accelerated compression apparatus according to claim 10, wherein
the control circuit records the new retiring position when the new retiring position does not exceed a position in the string to be compressed pointed by the issue pointer; and
the string matching processing pipeline stops processing the sub-string when a starting position of the sub-string processed by the string matching processing pipeline does not exceed the new retiring position.

15. The accelerated compression apparatus according to claim 14, wherein
the control circuit does not stop the string matching processing pipeline from processing the sub-string when the starting position of the sub-string processed by the string matching processing pipeline exceeds the new retiring position.

16. The accelerated compression apparatus according to claim 14, further comprising:
an intermediary buffer, configured to store all the issued sub-strings, wherein the starting position of the sub-string processed by the string matching processing pipeline is stored in an entry corresponding to the sub-string in the intermediary buffer.

17. The accelerated compression apparatus according to claim 10, wherein
the control circuit checks a distance between the new retiring position and the issuing position when the new retiring position does not exceed the issuing position; and
the control circuit resets the string matching processing pipeline and changes the issue pointer from pointing to the issuing position to pointing to the new retiring position when the distance is less than a threshold distance.

18. The accelerated compression apparatus according to claim 10, further comprising:
an intermediary buffer, configured to store all the issued sub-strings, wherein the sub-string corresponding to characters between positions pointed by the retire pointer and the issue pointer in the intermediary buffer is the sub-string currently processed in the string matching processing pipeline.

* * * * *